(12) United States Patent
Yamazaki et al.

(10) Patent No.: US 9,543,533 B2
(45) Date of Patent: Jan. 10, 2017

(54) DISPLAY DEVICE

(71) Applicant: Semiconductor Energy Laboratory Co., Ltd., Atsugi-shi, Kanagawa-ken (JP)

(72) Inventors: Shunpei Yamazaki, Setagaya (JP); Kensuke Yoshizumi, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 220 days.

(21) Appl. No.: 14/192,178

(22) Filed: Feb. 27, 2014

(65) Prior Publication Data

US 2014/0254111 A1   Sep. 11, 2014

(30) Foreign Application Priority Data

Mar. 7, 2013 (JP) ................................. 2013-045119

(51) Int. Cl.
*H05K 1/00* (2006.01)
*H01L 51/00* (2006.01)
(Continued)

(52) U.S. Cl.
CPC ... *H01L 51/0097* (2013.01); *H01L 2251/5338* (2013.01); *H05K 1/028* (2013.01);
(Continued)

(58) Field of Classification Search
CPC .. H05K 2201/05; H05K 1/0277; H05K 1/028; H05K 1/0283; H05K 1/147; H05K 1/189; H05K 2201/051; H05K 2201/052; H05K 2201/053; H05K 2201/055; H05K 2201/056; H05K 2201/057; H05K 2201/058
(Continued)

(56) References Cited

U.S. PATENT DOCUMENTS 5,612,840 A * 3/1997 Hiraoka ............... G11B 5/4833
                                                              360/245.9
6,688,528 B2    2/2004 Silverbrook
(Continued)

FOREIGN PATENT DOCUMENTS

CN      102203843 A      9/2011
CN      102736347 A      10/2012
(Continued)

OTHER PUBLICATIONS

International Search Report (Application No. PCT/JP2014/055704) Dated Jun. 3, 2014.
(Continued)

*Primary Examiner* — Binh Tran
(74) *Attorney, Agent, or Firm* — Robinson Intellectual Property Law Office; Eric J. Robinson

(57) ABSTRACT

One embodiment of the present invention provides a highly reliable display device. In particular, a display device to which a signal or a power supply potential can be supplied stably is provided. Further, a bendable display device to which a signal or a power supply potential can be supplied stably is provided. The display device includes, over a flexible substrate, a display portion, a plurality of connection terminals to which a signal from an outside can be input, and a plurality of wirings. One of the plurality of wirings electrically connects one of the plurality of connection terminals to the display portion. The one of the plurality of wirings includes a first portion including a plurality of separate lines and a second portion in which the plurality of lines converge.

18 Claims, 11 Drawing Sheets

(51) Int. Cl.
  *H05K 7/00*  (2006.01)
  *H05K 1/02*  (2006.01)
  *H05K 1/18*  (2006.01)
  *H05K 1/14*  (2006.01)

(52) U.S. Cl.
  CPC ......... *H05K 1/0277* (2013.01); *H05K 1/0283* (2013.01); *H05K 1/147* (2013.01); *H05K 1/189* (2013.01); *H05K 2201/05* (2013.01); *Y02E 10/549* (2013.01)

(58) Field of Classification Search
  USPC ................. 361/749, 679.21, 679.26, 679.27, 679.28, 361/679.3, 773, 774, 776, 777, 778; 174/254, 174/117 F, 117 FF; 349/149, 150, 152
  See application file for complete search history.

(56) References Cited

U.S. PATENT DOCUMENTS

| | | | |
|---|---|---|---|
| 7,019,718 B2 | 3/2006 | Yamazaki et al. | |
| 7,710,739 B2 | 5/2010 | Kimura et al. | |
| 8,294,869 B2 | 10/2012 | Yamaguchi et al. | |
| 8,576,209 B2 | 11/2013 | Miyaguchi | |
| 2007/0023758 A1* | 2/2007 | Tsurume | H01L 27/1266 257/66 |
| 2009/0040902 A1* | 2/2009 | Kamel | G11B 7/22 369/100 |
| 2010/0073620 A1 | 3/2010 | Yamaguchi et al. | |
| 2010/0317409 A1 | 12/2010 | Jiang et al. | |
| 2011/0261541 A1 | 10/2011 | Ogawa et al. | |
| 2012/0257362 A1 | 10/2012 | Suzuki et al. | |

FOREIGN PATENT DOCUMENTS

| | | | |
|---|---|---|---|
| JP | 56-063077 A | 5/1981 | |
| JP | 56-063077 U | 5/1981 | |
| JP | 57-164734 A | 10/1982 | |
| JP | 57-164734 U | 10/1982 | |
| JP | 58-025057 A | 2/1983 | |
| JP | 58-025057 U | 2/1983 | |
| JP | 59-037761 A | 3/1984 | |
| JP | 59-037761 U | 3/1984 | |
| JP | 04-062885 A | 2/1992 | |
| JP | 06-194680 A | 7/1994 | |
| JP | 11-052394 | 2/1999 | |
| JP | 11-305227 | 11/1999 | |
| JP | 2004-037859 A | 2/2004 | |
| JP | 2005-017567 A | 1/2005 | |
| JP | 2005-338179 A | 12/2005 | |
| JP | 2010-072380 A | 4/2010 | |
| JP | 2011-118082 A | 6/2011 | |
| JP | 2011-237661 A | 11/2011 | |
| JP | 2012-220636 A | 11/2012 | |
| WO | WO-2006/046679 | 5/2006 | |
| WO | WO-2011/070701 | 6/2011 | |

OTHER PUBLICATIONS

Written Opinion (Application No. PCT/JP2014/055704) Dated Jun. 3, 2014.

* cited by examiner

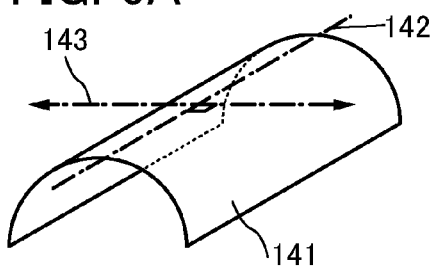
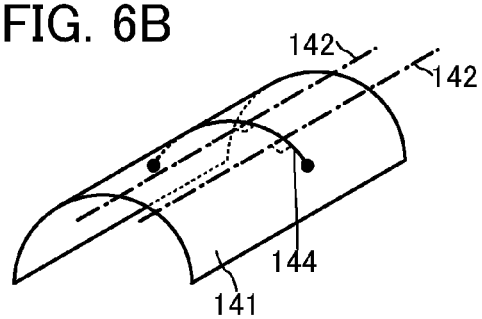
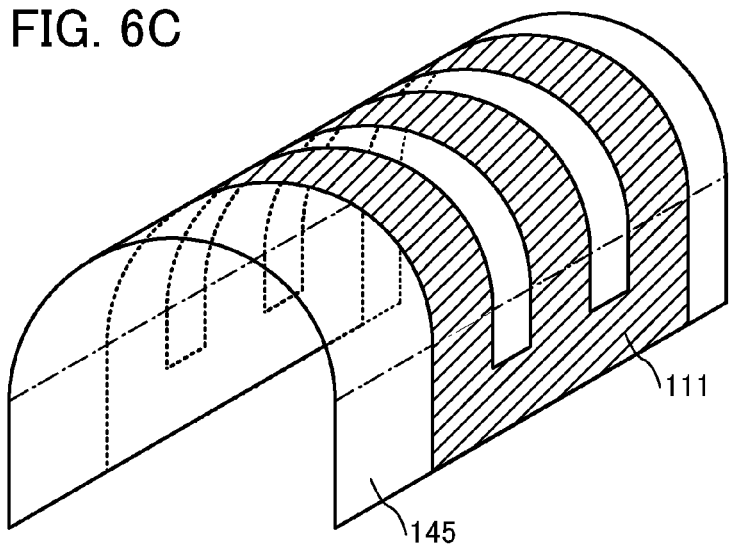
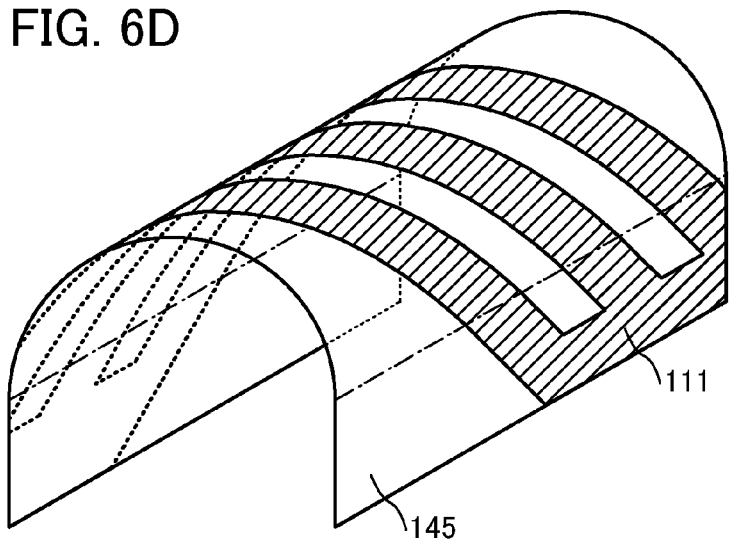

DISPLAY DEVICE

TECHNICAL FIELD

The present invention relates to a display device. In particular, one embodiment of the present invention relates to a display device including a bendable display portion.

BACKGROUND ART

In recent years, diversification of the shape of electronic devices having a display function has been required. For example, an electronic device including a display device in which a display element is provided over a flexible substrate that is bendable and can display images on the curved surface is demanded. This display device is also called a flexible display and is under development for practical application.

An organic electroluminescence (EL) element, a liquid crystal element, or the like can be used as a display element for flexible displays. The flexible display is, for example, an electronic paper including an element that performs display by an electrophoretic method or an electronic liquid powder method.

For example, Patent Document 1 discloses an organic EL display panel in which an organic EL element is provided over a resin substrate made of a flexible film.

REFERENCE

Patent Document

[Patent Document 1] International Publication No. 2006/046679

DISCLOSURE OF INVENTION

In an electronic device in which a display device is incorporated, a connection wiring that electrically connects a housing to the display device needs to be attached to the display device to supply a signal or a power supply potential to the display device. A typical example of the connection wiring is a flexible printed circuit (FPC). To attach an FPC to a substrate, thermocompression bonding is employed with an anisotropic conductive film (ACF) or the like.

However, a display device including a display element over a flexible substrate has a problem in that the substrate or a wiring provided over the substrate may be destroyed by heat or pressure applied by thermocompression bonding. Further, the display device also has a problem in that the connection wiring peels from the substrate by curving the substrate.

An object of one embodiment of the present invention is to provide a highly reliable display device. In particular, an object is to provide a display device to which a signal or a power supply potential can be supplied stably. Further, an object is to provide a bendable display device to which a signal or a power supply potential can be supplied stably.

Note that the descriptions of these objects do not disturb the existence of other objects. In one embodiment of the present invention, there is no need to achieve all the above-described objects. Other objects will be apparent from and can be derived from the description of the specification, the drawings, the claims, and the like.

One embodiment of the present invention is a display device including a flexible substrate, a display portion over the flexible substrate, a plurality of connection terminals to which a signal from an outside can be input over the flexible substrate, and a plurality of wirings over the flexible substrate. In the display device, one of the plurality of wirings electrically connects one of the plurality of connection terminals to the display portion. The one of the plurality of wirings includes a first portion including a plurality of separate lines into which the wiring is separated and a second portion in which the plurality of lines converge.

In the display device of one embodiment of the present invention, the first portion of the wiring preferably has a smaller thickness than the second portion.

Further in the display device of one embodiment of the present invention, the first portion of the wiring preferably has a larger thickness than the second portion.

Further in the display device of one embodiment of the present invention, the flexible substrate is preferably bent in a region overlapping with the first portion of the wiring.

Further in the display device of one embodiment of the present invention, it is preferable that a bending direction of the flexible substrate is not the same as an extending direction of the wiring in the first portion.

Further the display device of one embodiment of the present invention preferably includes an IC over the flexible substrate. In the display device, another one of the plurality of wirings electrically connects the IC to the display portion, and the IC is preferably provided between the first portion of the wiring and the connection terminal.

In this specification and the like, "to bend a surface" refers to shaping a surface that is flat so that a line on the shaped surface that connects arbitrary two points on the surface is continuously gradient. The curvature radius at an arbitrary point on the bent surface is greater than 0.

Further in this specification and the like, a bendable device refers to a device that does not lose its specific function when part of the device is bent at a predetermined curvature radius. For example, a bendable display device refers to a display device that can perform display even when part of the display device is bent.

With one embodiment of the present invention, a highly reliable display device can be provided. Further, a display device to which a signal or a power supply potential can be supplied stably can be provided. Further, a bendable display device to which a signal or a power supply potential can be supplied stably can be provided.

BRIEF DESCRIPTION OF DRAWINGS

In the accompanying drawings:

FIGS. 6A to 6D illustrate structural examples of wirings provided in a display device of one embodiment;

BEST MODE FOR CARRYING OUT THE INVENTION

Figure 1A:
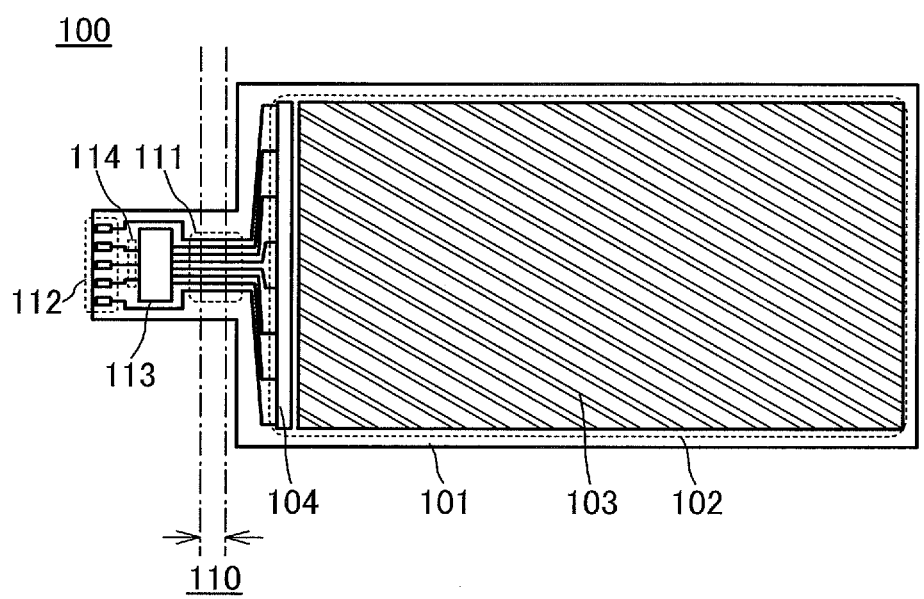
FIGS. 1A and 1B illustrate a structural example of a display device of one embodiment.

Embodiments will be described in detail with reference to drawings. Note that the present invention is not limited to the description below, and it is easily understood by those skilled in the art that various changes and modifications can be made without departing from the spirit and scope of the present invention. Therefore, the present invention should not be interpreted as being limited to the description of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of components is exaggerated for clarity in some cases. Therefore, the size of components is not limited to the relative size in the drawing.

Note that in this specification and the like, the expression "electrically connected" includes the case where components are connected through an "object having any electric function". There is no particular limitation on an "object having any electric function" as long as electric signals can be transmitted and received between components that are connected through the object. Examples of the "object having any electric function" include an electrode, a wiring, a switching element such as a transistor, a resistor, a coil, a capacitor, an element with a variety of functions, and a circuit with a variety of functions.

Embodiment 1

In this embodiment, configuration examples of a display device of one embodiment of the present invention will be described with reference to drawings.

[Configuration Example of Display Device]

FIG. 1A is a schematic top view of a display device 100 of one embodiment of the present invention.

The display device 100 includes a display portion 102, a plurality of wirings 111, a plurality of connection terminals 112, an IC 113, and a plurality of wirings 114 over a flexible substrate 101.

The display portion 102 includes a pixel portion 103 and a driver circuit 104.

In the pixel portion 103, pixels each including a display element are arranged in a matrix. By driving each pixel, an image can be displayed on the pixel portion 103.

As a display element that can be used in a pixel, an organic electroluminescence (EL) element, a liquid crystal element, or the like can be used. Alternatively, an element that performs display by an electrophoretic method, an electronic liquid powder method, or the like may be included in the pixel.

Using an organic EL element as a display element provided in a pixel is preferable because a backlight is not required. When a backlight is required in the case of using a liquid crystal element as a display element, a flexible backlight is attached to the side of the substrate 101 that is opposite to the side provided with the display portion 102, so that the backlight can be bent in accordance with bending of the substrate 101.

The driver circuit 104 is a circuit that drives the pixels in the pixel portion 103 and may be a circuit having a function of a gate driver circuit, for example. The driver circuit 104 preferably consists of semiconductor elements such as thin film transistors formed over the substrate 101. Note that the driver circuit 104 is not necessarily provided over the substrate 101, and the IC 113 may have the function of the driver circuit 104.

The substrate 101 has a shape including a projecting part as illustrated in FIG. 1A. Over the projecting part of the substrate 101, part of the plurality of wirings 111, the plurality of connection terminals 112, the IC 113, and the wirings 114 are provided.

The connection terminals 112 are input terminals of various signals for driving the display portion 102, such as a power supply voltage, an image signal, or a timing signal from the outside.

The IC 113 is a circuit that drives the display portion 102 and may be a circuit having a function of a source driver circuit, for example. Alternatively, the IC 113 may be a circuit that has a function of performing image processing on the input image signal to generate a new image signal. As illustrated in FIG. 1A, it is preferable to provide the IC 113 over the substrate 101. Note that the IC 113 is not necessarily provided over the substrate 101. For example, the IC 113 may be provided outside the display device 100 so that an output signal of the IC 113 is input to the display device 100 through the connection terminals 112 and the wirings 111.

One of the plurality of wirings 114 is a wiring that electrically connects one of the plurality of connection terminals 112 to the IC 113. Signals for driving the IC 113 or the display portion 102 are input to the connection terminals 112 to which the wirings 114 are electrically connected. Note that when the IC 113 is not provided, the wirings 114 are unnecessary.

Figure 1B:
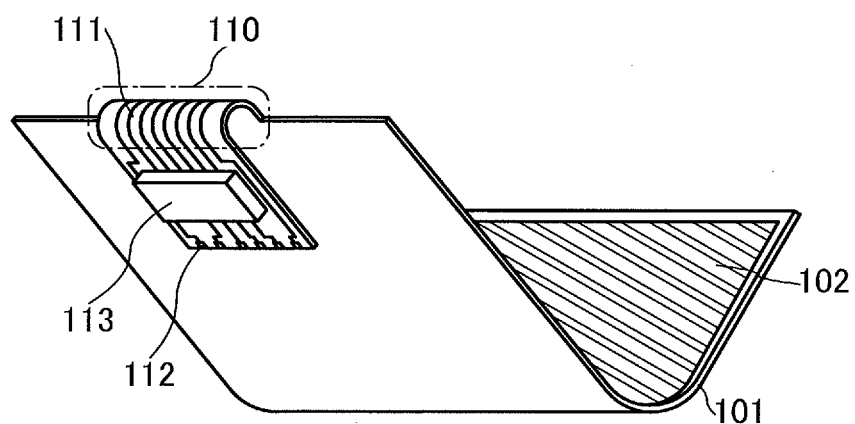

The wirings 111 are wirings arranged between the connection terminals 112 and the display portion 102. The wirings 111 are electrically connected to the display portion 102, and signals for driving the display portion 102 can be input to the display portion 102 through the wirings 111. Although the number of wirings 111 illustrated in FIGS. 1A and 1B is small for simplicity, the practical number of wirings 111 is usually more than the illustrated number.

Some of the wirings 111 each directly and electrically connect the connection terminal 112 to the display portion 102, while the others each electrically connects the IC 113 to the display portion 102. All the wirings 111 have a common function of transmitting a signal for driving the display portion 102 to the display portion 102. Accordingly, these wirings are collectively referred to as the wirings 111 in the following description.

The signals input to the connection terminals 112 that are electrically connected to the display portion 102 through the wirings 111 are, for example, a signal for driving the driver circuit 104 and a signal including a voltage that is different from the power supply voltage for driving the IC 113.

In the structure illustrated in FIG. 1A, the IC 113 is provided between the connection terminals 112 and the display portion 102, and the number of wirings 114 between the connection terminals 112 and the IC 113 is not equal to the number of wirings 111 between the IC 113 and the display portion 102.

In the display device 100, the substrate 101 can be bent at a bending portion 110 illustrated in FIG. 1A that overlaps with the wirings 111, and the portion of the substrate 101 over which the connection terminals 112 and the IC 113 are provided can be bent and folded toward the rear side of the display surface.

FIG. 1B schematically illustrates the display device 100 in which the substrate 101 is bent and folded at the bending portion 110. In FIG. 1B, the display portion 102 is also bent in a concave curve.

As illustrated in FIG. 1B, the projecting portion of the substrate 101, over which the connection terminals 112 and the IC 113 are provided, can be bent and folded toward the rear side of the display surface. This allows a reduction in the area of the display device 100 that is visible when looking at the display surface side, and the display device 100 can have a shorter side frame. Accordingly, in the case of using the display device 100 in an electronic device, for example, miniaturization of the electronic device can be achieved.

Further, the connection terminals 112 provided on the folded projecting portion of the substrate 101 can be connected to a connector provided in a housing of the electronic device, for example. In other words, part of the display device 100 can function as an FPC. In this way, the possibility of causing problems that might occur when an FPC is attached to a flexible display device, such as the destruction of the substrate or the wirings provided over the substrate or peeling of the FPC when the substrate 101 is bent, can be eliminated, for example. Thus, an extremely highly reliable display device can be obtained.

Further, in the display device 100, the display portion 102 can be bent in a concave curve as illustrated in FIG. 1B or in a convex curve. The image can be displayed on the curved surface. In this case, a variety of image expressions or applications that a display device with a flat display surface cannot exhibit can be exhibited.

Furthermore, a flexible touch sensor may be provided so as to overlap with the display portion 102.

[Wiring Shape]

Figure 2A:
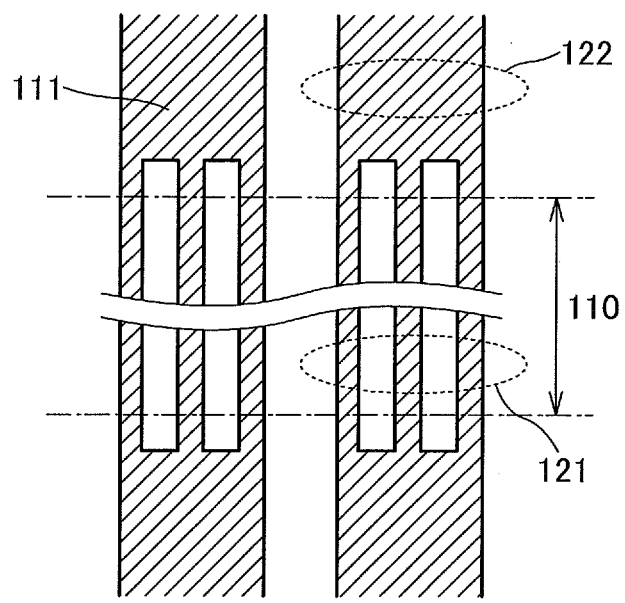
FIGS. 2A and 2B illustrate structural examples of wirings provided in a display device of one embodiment.

Next, examples of the shape of the wirings 111 will be described. FIG. 2A is a top view schematically illustrating part of two parallel wirings 111.

Openings are provided in part of each wiring 111 and separate the wiring 111 into a plurality of lines. In other words, each of the wirings 111 includes a first portion 121 including the plurality of separate lines and a second portion 122 in which the plurality of lines converge.

When part of the substrate 101 is bent, it is preferable that the bending portion 110 overlap with the first portion 121.

In the case of bending a portion where a wiring that transmits a signal to the display portion 102 is provided, a crack may occur in the wiring by stress caused by the bending and in the worst case a break of the wiring may occur. When a break of the wiring occurs, a signal cannot be transmitted to the display portion 102, leading to a display defect.

However, when the wiring 111 that crosses over the bending portion 110 has the above-described shape, even if one of the plurality of separated lines is broken, the other lines can transmit a signal. Thus, a display defect caused by bending is prevented and the display device 100 with high reliability can be provided.

Figure 2B:
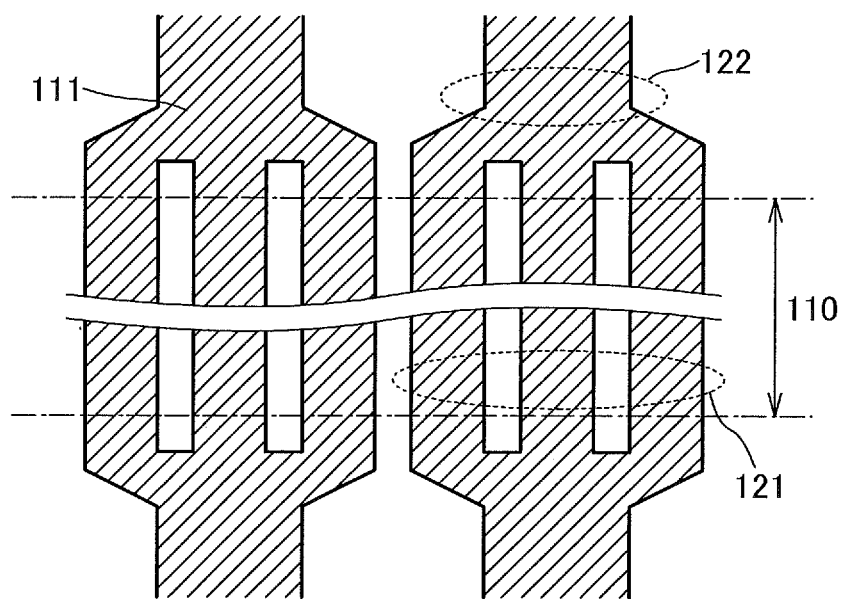

Further, as illustrated in FIG. 2B, the line width of each of the plurality of separate lines in the first portion 121 of the wiring 111 is preferably as large as possible. With this shape, an increase in resistance caused by separation of the wiring 111 can be prevented. Moreover, even when one or more lines of the plurality of separate lines are broken, an increase in resistance can be prevented; accordingly, an influence of a signal delay or the like can be reduced.

The wirings 111 are each divided into three lines in FIGS. 2A and 2B; however, other than three lines, the wirings 111 may be each divided into two or more lines. A larger number of separate lines lower the risk of wiring breaks that may occur when the wiring is bent.

When the wirings 111 have the above-described shapes, the curvature radius at the bending portion 110 of the substrate 101 can be set smaller, and the substantial thickness of the display device 100 in which part of the substrate 101 is bent toward the rear side can be small. The allowable curvature radius at the midpoint position of the whole thickness of the display device 100 in the bending portion 110 can be as small as 0.1 mm or more and 10 mm or less, preferably 0.5 mm or more and 5 mm or less, further preferably 0.5 mm or more and 2 mm or less.

Here, examples of the cross-sectional structure of the bending portion 110 in the display device 100 in the bent state in FIG. 1B will be described with reference to FIGS. 3A and 3B.

Figure 3A:
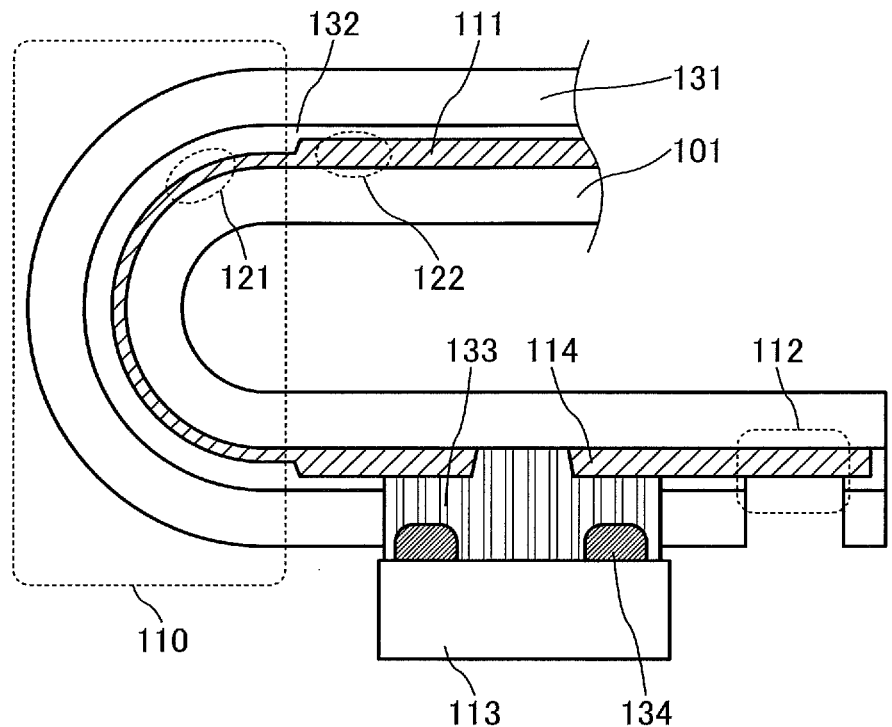
FIGS. 3A and 3B illustrate structural examples of a display device of one embodiment.

FIG. 3A schematically illustrates a cross section of the bending portion 110 in the display device 100. In FIG. 3A, a region including the wiring 111, the IC 113, the wiring 114, and the connection terminal 112 is shown.

In FIG. 3A, the wiring 111 is formed over the substrate 101, and a flexible substrate 131 is provided over the wiring 111 with an adhesive layer 132 interposed therebetween.

In order to electrically connect the wiring 111 and the wiring 114 to the IC 113, an end portion of the wiring 111 and an end portion of the wiring 114 are exposed by providing an opening in the substrate 131 and the adhesive layer 132 that are positioned on the wiring 111 and the wiring 114. In the opening, bumps 134 of the IC 113 are electrically connected to the wiring 111 or the wiring 114 through an ACF 133.

Furthermore, another opening is provided in the substrate 131 and the adhesive layer 132 that are positioned on part of the wiring 114; thus, a top surface of the wiring 114 is exposed. The exposed part of the wiring 114 functions as the connection terminal 112.

Here, the first portion 121 and the second portion 122 in the wiring 111 preferably have different thicknesses.

FIG. 3A illustrates a case where the thickness of the first portion 121 is smaller than that of the second portion 122 in the wiring 111.

In the bending portion 110, the stress applied by bending varies between the upper side and the lower side of the thickness direction of the wiring 111. By thinning the first portion 121 of the wiring 111 in the region overlapping with the bending portion 110, the difference in the stress applied by bending between the upper side and the lower side can be reduced, which can lower the risk of breaking the wiring 111.

It is preferable to use a low-resistant conductive material such as Cu for the first portion 121 because the wiring resistance might increase when the first portion 121 of the wiring 111 is thinned. The first portion 121 and the second portion 122 of the wiring 111 may be made of different materials or may be made of the same material.

Further, it is preferable that the line width of the first portion 121 be larger than that of the second portion 122 in the wiring 111 because an increase in wiring resistance can be prevented. In the case where the separate lines are included in the first portion 121 of the wiring 111, the top view as illustrated in FIG. 2B can be used to effectively prevent an increase in wiring resistance.

Figure 3B:
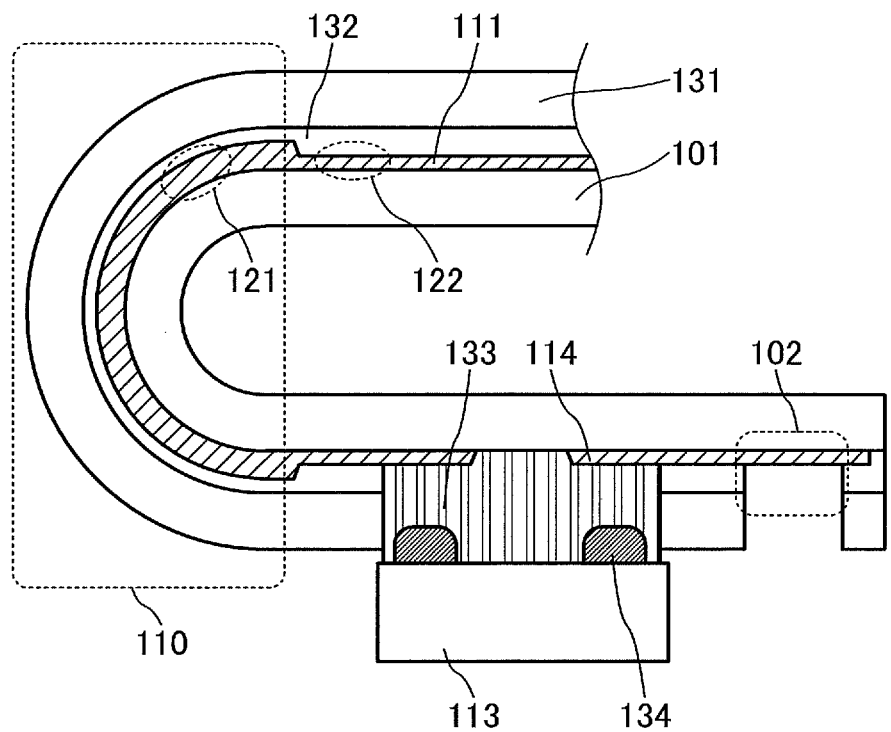

FIG. 3B illustrates a case where the thickness of the first portion 121 is larger than that of the second portion 122 in the wiring 111.

By thickening the first portion 121 of the wiring 111 in the region overlapping with the bending portion 110, the mechanical strength of the wiring 111 can be increased, which can prevent a break of the wiring 111 when the wiring 111 is bent.

In the case where the wiring 111 is separated into a plurality of lines in the first portion 121 as illustrated in the top view of FIG. 2A, the thickness of the first portion 121 is set large, so that an increase in wiring resistance can be prevented.

Although FIGS. 3A and 3B illustrate the cases in which the substrate 131 is provided over the wiring 111 with the adhesive layer 132 interposed therebetween, the configuration is not limited to these configurations as long as a surface of the wiring 111 is insulated without being exposed. For example, when the surface of the wiring 111 is insulated by forming a resin over the wiring 111, it is possible to reduce the thickness of the display device 100 in the region where the wiring 111 is provided; accordingly, the display device can be easily bent. Further in this case, by removing the resin over part of the wiring 111 or the wiring 114 to expose a surface thereof, part of the wiring 111 or the wiring 114 can function as the connection terminal 112.

Figure 4A:
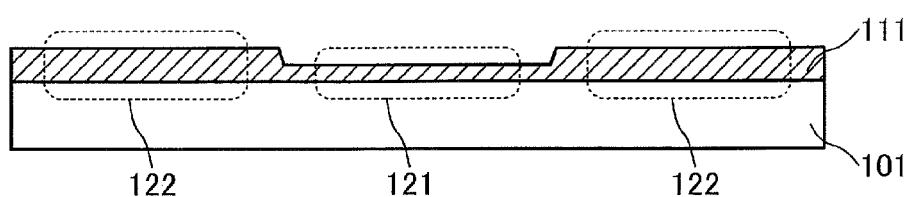
FIGS. 4A to 4C illustrate structural examples of wirings provided in a display device of one embodiment.
Figure 4B:
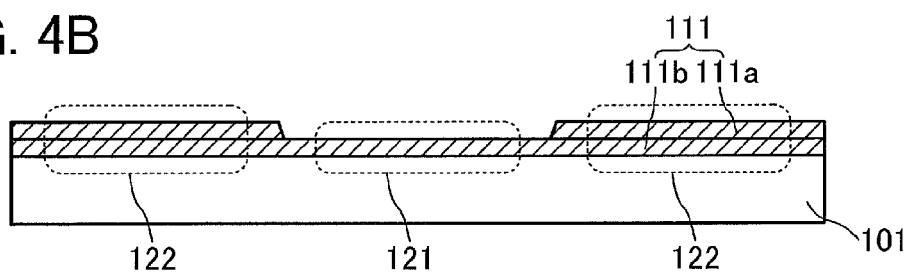
Figure 4C:
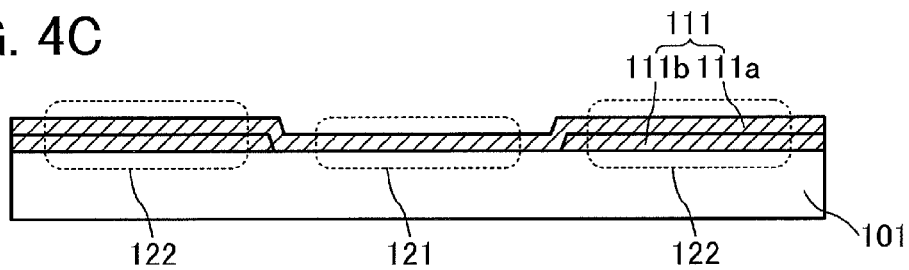

FIGS. 4A to 4C illustrate schematic cross-sectional views of part of the wiring 111.

In the case where the thickness of the first portion 121 is set different from that of the second portion 122 in the wiring 111, the thick portion and the thin portion may be formed of a single layer of the same material as illustrated in FIG. 4A. In this case, the thin portion may be formed by removing part of an upper portion of the wiring by etching (also referred to as half etching).

Alternatively, the thick portion may be formed of stacked layers including two or more layers, and the thin portion may be formed of one or more layers obtained by removing one or more layers from the above stacked layers.

FIGS. 4B and 4C are schematic cross-sectional views in which the thick portion of the wiring 111 has stacked layers of a wiring 111a and a wiring 111b.

As illustrated in FIG. 4B, the thin portion of the wiring 111 may be formed by stacking the wiring 111a over the wiring 111b and then removing part of the wiring 111a by etching. At this time, it is preferable to use different materials for the wiring 111a and the wiring 111b because unintended etching of an upper portion of the wiring 111b at the time of etching the wiring 111a can be prevented; thus, the thickness of the wiring 111b does not become smaller than the intended thickness.

As illustrated in FIG. 4C, the thick portion of the wiring 111 may be formed by removing part of the wiring 111b by etching and then providing the wiring 111a so as to cover an end portion of the wiring 111b. This configuration is preferable because defects are not caused by etching even when the same material is used for the wiring 111a and the wiring 111b.

Here, it is preferable that a material used for the first portion 121 of the wiring 111 contain a highly ductile or highly malleable material. It is particularly preferable to use a material having both a high ductility and a high malleability. When the wiring over the bending portion 110 has a high ductility, a break of the wiring 111 does not easily occur by bending. When the wiring has a high malleability, a crack does not easily occur in the wiring 111 when the wiring 111 is returned to a flat state from the bent state. Examples of the material having both a high ductility and a high malleability include a metal material such as gold, silver, platinum, iron, nickel, copper, aluminum, zinc, and tin and an alloy containing this metal material.

In the case where the first portion 121 of the wiring 111 has stacked layers of two or more layers, by using the above material for at least one of the layers, preferably for all of the layers, a break or a crack of the wiring 111 can be prevented.

The wiring shape has been described so far.

[Other Configuration Examples of Display Device]

Configuration examples of a display device that are different from that of the display device 100 illustrated in FIGS. 1A and 1B will be described below.

Figure 5A:
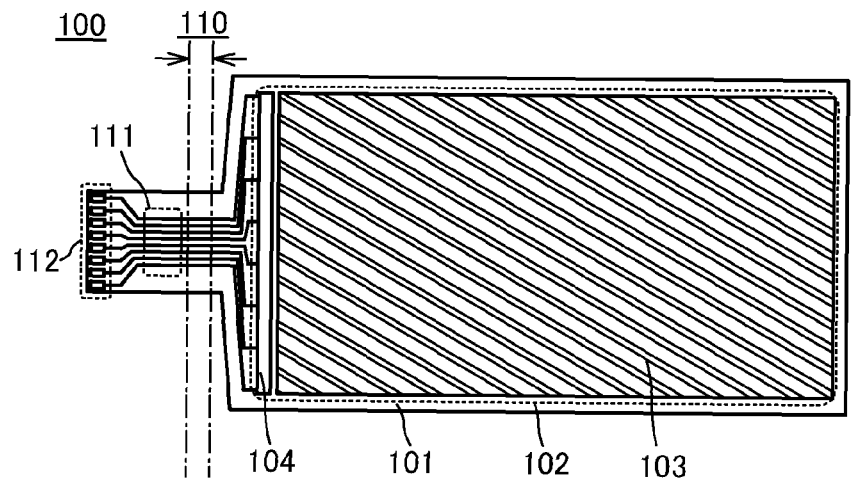
FIGS. 5A to 5C illustrate structural examples of a display device of one embodiment.

FIG. 5A illustrates an example of the display device 100 in which the IC 113 is not incorporated.

In the display device 100 illustrated in FIG. 5A, the IC 113 and the wiring 114 are not provided. In addition, the display portion 102 is directly and electrically connected to the connection terminals 112 through the wirings 111.

Figure 5B:
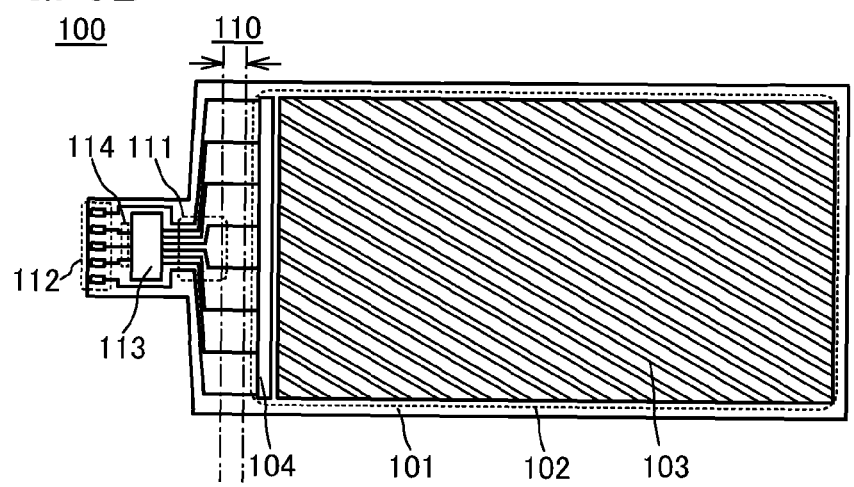

FIG. 5B illustrates an example in which the bending portion 110 is located not in the projecting portion of the substrate 101 but in a portion close to the display portion 102. This configuration allows a further reduction in the area of the display device 100 that is visible when looking at the display surface side, and the display device 100 can have a shorter side frame.

Figure 5C:
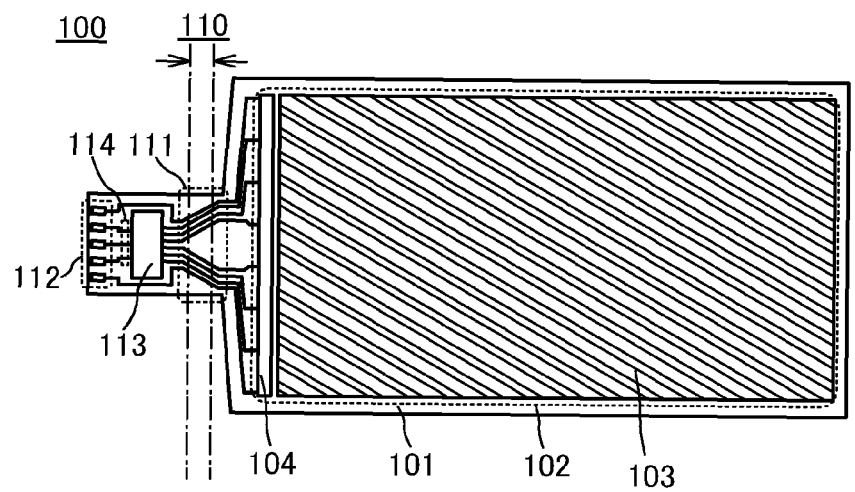

FIG. 5C illustrates a configuration in which the wirings 111 are arranged so that the bending direction of the substrate 101 is not the same as the extending direction of the wirings 111 in a region where the wirings 111 and the bending portion 110 cross each other. In other words, the wirings 111 are provided so as to obliquely cross the bending portion 110.

The bending direction and the extending direction of the wirings 111 will be explained with reference to FIGS. 6A to 6D.

First, the bending direction of a surface will be explained with reference to FIG. 6A. When a surface is bent without expansion and contraction, a tangent line 142 at an arbitrary point on a formed curved surface 141 that is tangential to the curved surface 141 is determined as having no alternative. Here, the direction that is perpendicular to the tangent line 142 and along the tangent plane to the curved surface at the arbitrary point is a bending direction 143, as indicated by a dashed-and-dotted line arrow in FIG. 6A.

As illustrated in FIG. 6B, once two arbitrary points on the curved surface 141 are designated, the shortest line 144 that connects these two points on the curved surface is determined as having no alternative. In the case where the line 144 crosses the tangent line 142 at right angles on an arbitrary point on the line 144, the bending direction of the curved surface 141 is the same as the extending direction of the line 144.

An angle formed between the tangent line 142 and the shortest line 144 that connects arbitrary two points on the curved surface 141 along the curved surface 141 is the same at any point on the line 144. Since the tangent line 142 and the bending direction 143 always cross each other at right angles, an angle obtained by subtracting an acute angle (including 90 degrees) formed between the line 144 and the tangent line 142 from 90 degrees is referred to as an angle formed between the extending direction of the line 144 and the bending direction of the curved surface 141. FIG. 6B illustrates the case where the angle formed between the extending direction of the line 144 and the bending direction of the curved surface 141 is 0 degree.

FIGS. 6C and 6D each illustrate the wiring 111 when a surface 145 on which the wiring 111 is formed is bent.

FIG. 6C illustrates the arrangement of the wiring 111, where the extending direction of the wiring 111 is the same as (is parallel with) the bending direction of the surface 145.

In this case, the curvature radius of the wiring 111 along the extending direction is the smallest and is equal to that of the surface 145.

FIG. 6D illustrates the arrangement of the wiring 111, where the extending direction of the wiring 111 is not the same as the bending direction of the surface 145.

In other words, the wiring 111 is arranged so that the angle formed between the extending direction of the wiring 111 and the bending direction is larger than 0 degree.

The angle formed between the extending direction of the wiring 111 and the bending direction may be, for example, greater than or equal to 5 degrees and less than 90 degrees, preferably greater than or equal to 15 degrees and less than or equal to 60 degrees, and further preferably greater than or equal to 30 degrees and less than or equal to 60 degrees.

In this case, the curvature radius of the wiring 111 along the extending direction is larger than that of the surface 145. Accordingly, the risk of destruction or a break of the wiring 111 when the surface 145 is bent can be lowered, and a highly reliable display device can be provided.

In addition, the surface 145 (or the substrate 101) can be bent at a curvature radius that is smaller than the curvature radius at which destruction or a break of the wiring 111 might occur when the wiring 111 is bent. Accordingly, the substantial thickness of the display device 100 in which part of the substrate 101 is bent and folded toward the rear side can be small.

Next, configuration examples of the display device other than the above examples will be described with reference to FIGS. 7A to 7D.

Figure 7A:
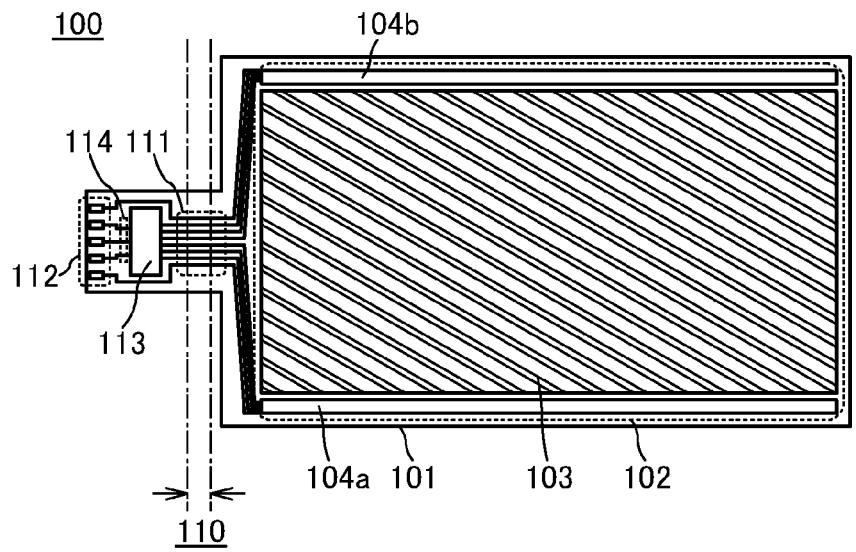
FIGS. 7A to 7D illustrate structural examples of a display device of one embodiment.

FIG. 7A illustrates an example in which two driver circuits (driver circuits 104a and 104b) between which the pixel portion 103 is positioned are provided instead of the driver circuit 104 provided close to the projecting portion of the substrate 101 in FIG. 1A. This configuration including two separate driver circuits is particularly preferable in the case where the pixel portion 103 in the display device has high definition.

Depending on the type of the electronic device in which the display device 100 is incorporated, the display portion 102 is configured to bend at a certain position. For example, in an electronic device that can be folded at a predetermined position, the display portion 102 is repeatedly bent always at the same position. In this case, the driver circuits 104a and 104b repeatedly change between the flat state and the bent state, which may degrade electric characteristics of elements such as transistors included in the driver circuit 104a and the driver circuit 104b.

Figure 7B:
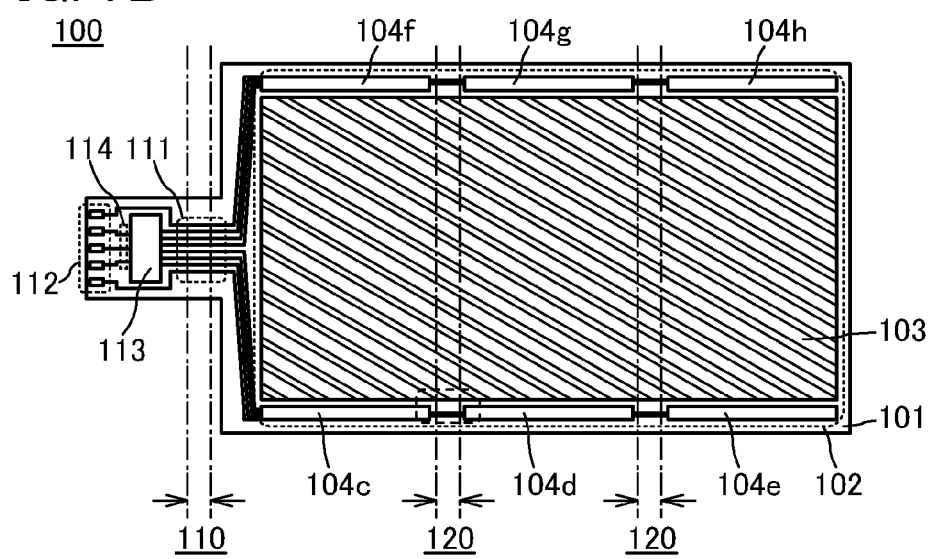

It is preferable to divide the driver circuit such that an area overlapping with the bending portion 120 of the display portion 102 is sandwiched between the divided driver circuits as illustrated in FIG. 7B. In FIG. 7B, the driver circuit 104a in FIG. 7A is divided into three driver circuits (driver circuit 104c, driver circuit 104d, driver circuit 104e). A bending portion 120 is provided between the driver circuit 104c and the driver circuit 104d, and another bending portion 120 is provided between the driver circuit 104d and the driver circuit 104e. Similarly, the driver circuit 104b in FIG. 7A is divided into a driver circuit 104f, a driver circuit 104g, and a driver circuit 104h.

Figure 7C:
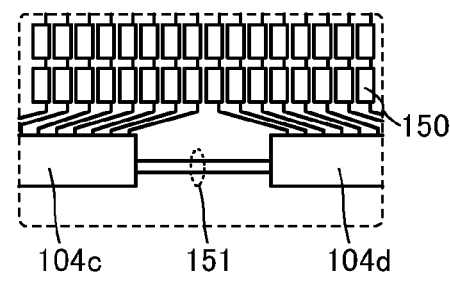

FIG. 7C is an enlarged view of a region surrounded by a broken line in FIG. 7B. Two divided driver circuits (driver circuit 104c, driver circuit 104d) and a plurality of pixels 150 arranged in a matrix and electrically connected to either of the driver circuits are illustrated in FIG. 7C.

A variety of signals for driving the driver circuit 104d input from the wirings 111 can be input to the driver circuit 104d through a plurality of wirings 151 provided between the driver circuit 104c and the driver circuit 104d. At this time, the distance between circuit elements (e.g., shift registers, buffers) in the driver circuit 104c and the driver circuit 104d is shorter than the distance between the pixels 150.

Figure 7D:
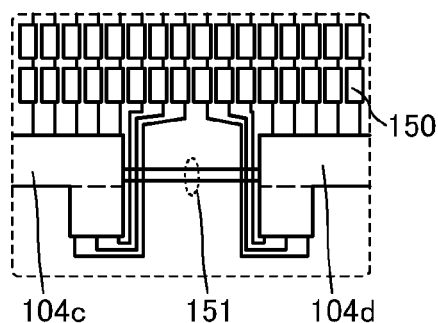

Further, the configuration illustrated in FIG. 7D in which part of the driver circuit 104c and part of the driver circuit 104d are provided to extend toward the outside may be employed. With this configuration, the distance between the circuit elements (shift registers, buffers) in the driver circuit 104c and the driver circuit 104d is not shortened and can be set similar to the distance in the case where the driver circuit is not divided. This configuration is particularly effective for a high-definition display device including the pixels 150.

Although the driver circuit divided into three parts has been described here, the division number of the driver circuit may be two or four or more without being limited to three.

Other configuration examples of the display device have been described so far.

This embodiment can be implemented in combination with any of the other embodiments disclosed in this specification as appropriate.

Embodiment 2

An example of a method for manufacturing a display device of one embodiment of the present invention will be described below.

[Example of Manufacturing Method]
<Formation of Separation Layer>

First, a separation layer 202 is formed over a supporting substrate 201.

As the supporting substrate 201, a substrate having heat resistance to at least the heat applied in a subsequent process is used. Examples of the supporting substrate 201 include a glass substrate, a resin substrate, a semiconductor substrate, a metal substrate, and a ceramic substrate.

As a material of the separation layer 202, a high melting point metal material such as tungsten, titanium, or molybdenum can be used, for example. Tungsten is preferably used.

The separation layer 202 can be formed by a sputtering method, for example.

<Formation of Another Separation Layer and Oxide Layer>

Then, a separation layer 203 is formed over the separation layer 202. An oxide layer 211 is formed between the separation layer 202 and the separation layer 203.

As a material of the separation layer 203, an inorganic insulating material such as silicon oxide, silicon oxynitride, silicon nitride oxide, silicon nitride, or aluminum oxide can be used. The separation layer 203 can be a single layer or stacked layers containing the above inorganic insulating material.

The separation layer 203 has particularly preferably a stacked structure including two or more layers in which at least the layer closest to the separation layer 202 is a layer that releases hydrogen by being heated. For example, the separation layer 203 has a stacked structure including a layer containing silicon oxynitride and a layer containing silicon nitride from the separation layer 202 side.

Note that in this specification and the like, "silicon oxynitride" contains more oxygen than nitrogen, meanwhile, "silicon nitride oxide" contains more nitrogen than oxygen.

The separation layer 203 can be formed by a film formation method such as a sputtering method or a plasma CVD method. In particular, the separation layer 203 is preferably formed by a plasma CVD method using a deposition gas containing hydrogen.

Here, a surface of the separation layer 202 is oxidized at the time of formation of the separation layer 203, whereby the oxide layer 211 can be formed between the separation layer 202 and the separation layer 203.

The oxide layer 211 is a layer containing an oxide of the metal that is contained in the separation layer 202. The oxide layer 211 is preferably a layer containing tungsten oxide.

Tungsten oxide is generally represented by $WO_{(3-x)}$ and is a non-stoichiometric compound that can have a variety of compositions, typically $WO_3$, $W_2O_5$, $W_4O_{11}$, and $WO_2$. Titanium oxide $TiO_{(2-x)}$ and molybdenum oxide $MoO_{(3-x)}$ are also non-stoichiometric compounds.

The oxide layer 211 at this stage preferably contains a large amount of oxygen. For example, in the case where tungsten is used for the separation layer 202, the oxide layer 211 is preferably a tungsten oxide layer containing $WO_3$ as its main component.

The oxide layer 211 can be formed on the surface of the separation layer 202 in advance by performing plasma treatment on the surface of the separation layer 202 in an atmosphere containing a dinitrogen monoxide gas before formation of the separation layer 203. When such a method is employed, the thickness of the oxide layer 211 can vary depending on the conditions of the plasma treatment, and the thickness of the oxide layer 211 can be controlled more effectively than in the case where plasma treatment is not performed.

The thickness of the oxide layer 211 is, for example, more than or equal to 0.1 nm and less than or equal to 100 nm, preferably more than or equal to 0.5 nm and less than or equal to 20 nm. Note that the oxide layer 211 with an extremely small thickness cannot be observed in a cross-sectional image in some cases.

Figure 8A:
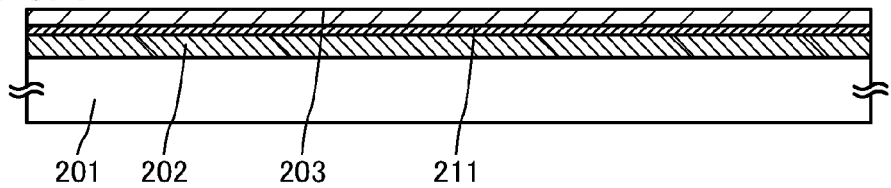
FIGS. 8A to 8F illustrate an example of a method for manufacturing a display device of one embodiment.

FIG. 8A illustrates a schematic cross-sectional view at this stage.

<Heat Treatment>

Next, heat treatment is performed to change the quality of the oxide layer 211.

By the heat treatment, hydrogen is released from the separation layer 203 to the oxide layer 211.

The metal oxide in the oxide layer 211 is reduced by hydrogen supplied to the oxide layer 211, so that a plurality of regions with different proportions of oxygen are mixed in the oxide layer 211. For example, in the case where tungsten is used for the separation layer 202, $WO_3$ in the oxide layer 211 is reduced to generate an oxide with proportion of oxygen lower than that of $WO_3$ (e.g., $WO_2$), resulting in a state where $WO_3$ and the oxide with the lower proportion of oxygen are mixed. The crystal structure of such a metal oxide depends on the proportion of oxygen; thus, when a plurality of regions with different proportions of oxygen are provided in the oxide layer 211, the mechanical strength of the oxide layer 211 is reduced. As a result, the oxide layer 211 is likely to be damaged inside, so that the separation property in a later separation step can be increased.

The heat treatment may be performed at a temperature higher than or equal to the temperature at which hydrogen is released from the separation layer 203 and lower than the temperature at which the supporting substrate 201 is softened. Further, the heat treatment is preferably performed at a temperature higher than or equal to the temperature at which a reduction reaction between hydrogen and the metal oxide in the oxide layer 211 occurs. For example, in the case where tungsten is used for the separation layer 202, the heating temperature is higher than or equal to 420° C., higher than or equal to 450° C., higher than or equal to 600° C., or higher than or equal to 650° C.

The higher the temperature of the heat treatment is, the more the amount of hydrogen released from the separation layer 203 can be, leading to improved separation property. However, even when the heating temperature is lowered in consideration of the heat resistance of the supporting substrate 201 and the productivity, a high separation property can be achieved by forming the oxide layer 211 in advance by performing plasma treatment on the separation layer 202 as described above.

<Formation of Display Portion and Wirings>

Figure 8B:
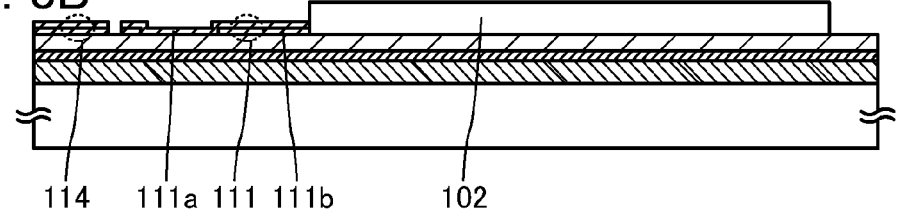

Next, the display portion 102, the wiring 111, and the wiring 114 are formed over the separation layer 203 (FIG. 8B).

The display portion 102 includes at least a display element, and may additionally include a wiring that is electrically connected to the display element or a transistor used in a circuit that controls driving of the display element.

In the case of manufacturing a bottom-gate transistor as the transistor included in the display portion 102, a gate electrode, a gate insulating layer, a semiconductor layer, and a source and drain electrodes may be formed in this order over the separation layer 203.

Note that the structure of the transistor may be a forward staggered transistor, an inverted staggered transistor, or the like. Alternatively, a top-gate transistor or a bottom-gate transistor may be used. In addition, a channel-etched transistor or a channel protective transistor may be used. In the case of a channel protective transistor, a channel protective film may be provided only over a channel region. Alternatively, an opening may be formed only in a portion where a source and drain electrodes are in contact with a semiconductor layer and a channel protective film may be provided in an area other than the opening.

As a semiconductor applicable to a semiconductor layer in which a channel of a transistor is formed, for example, a semiconductor material such as silicon or germanium, a compound semiconductor material, an organic semiconductor material, or an oxide semiconductor material may be used.

Further, there is no particular limitation on the crystallinity of a semiconductor used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of transistor characteristics can be reduced.

For example, in the case of using silicon as the semiconductor, amorphous silicon, microcrystalline silicon, polycrystalline silicon, single crystal silicon, or the like can be used.

In the case of using an oxide semiconductor as the semiconductor, an oxide semiconductor containing at least one of indium, gallium, and zinc is preferably used. Typically, an In—Ga—Zn-based metal oxide can be given. An oxide semiconductor having a wider band gap and a lower carrier density than silicon is preferably used, in which case off-state leakage current can be reduced.

As the display element provided in the display portion 102, a light-emitting element in which a layer containing a light-emitting organic compound is interposed between a pair of electrodes is formed over the separation layer 203, so that a flexible light-emitting device can be manufactured. For example, a flexible lighting device (or a light source) including a light-emitting element can be manufactured, or an image display device may be manufactured by forming a plurality of pixels including transistors and display elements such as light-emitting elements or liquid crystal elements over the separation layer 203. Examples of the flexible image display device will be described in later embodiment.

Here, the wiring 111 and the wiring 114 are preferably formed by processing the same layer that forms a wiring and an electrode included in the display portion 102. As examples of the wiring and the electrode included in the display portion 102, a gate electrode, a source electrode, and a drain electrode of a transistor, an electrode included in a light-emitting element, and a wiring that electrically connects the transistor to the light-emitting element can be given.

FIG. 8B illustrates an example in which the wiring 111 has a stacked structure including the wiring 111a and the wiring 111b. In the wiring 111, a portion where only the wiring 111a is formed corresponds to the first portion, and a portion where the wiring 111a and the wiring 111b are stacked corresponds to the second portion. The wiring 114 has the same structure as the second portion of the wiring 111. In this case, the wiring 111b can be formed using the same material as that of the gate electrode of the transistor, and the wiring 111a can be formed using the same material as that of the source or drain electrode of the transistor, for example. Thus, the wiring 111 can be formed without increasing the steps.

<Bonding>

Figure 8C:
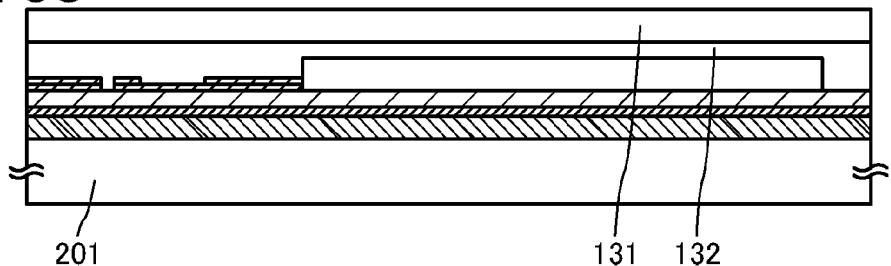

Next, the supporting substrate 201 and the substrate 131 are bonded to each other by the adhesive layer 132 (FIG. 8C).

As the substrate 131, a flexible substrate is preferably used. For example, a metal substrate or a glass substrate which is thin enough to have flexibility can be used as well as a resin such as polyethylene terephthalate (PET) or polyethylene naphthalate (PEN). A composite material in which two or more of a metal, glass, and a resin are stacked can also be used.

In the case of using a resin as the substrate 131, a barrier layer that does not easily transmit impurities such as water is preferably provided on either surface of the substrate 131. For example, a layer of silicon oxide, silicon oxynitride, silicon nitride oxide, silicon nitride, aluminum oxide, or the like may be provided.

A thermosetting resin or an ultraviolet curable resin can be used for the adhesive layer 132 as long as the resin can firmly bond surfaces to be bonded. For example, an acrylic resin, a urethane resin, an epoxy resin, or a resin having a siloxane bond can be used. In the case where the substrate 131 is removed later, a water-soluble resin, a resin soluble in an organic solvent, or the like can be used.

<Separation>

Figure 8D:
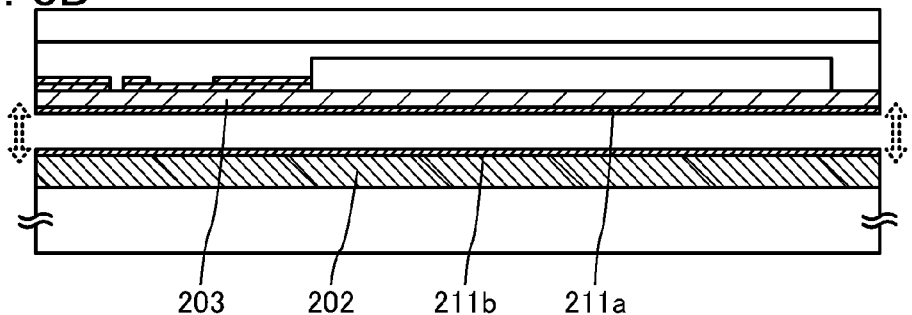

Next, the separation layer 202 and the separation layer 203 are separated from each other at the oxide layer 211 (FIG. 8D).

For the separation, for example, the supporting substrate 201 or the substrate 131 is fixed to a suction stage and a separation starting point is formed between the separation layer 202 and the separation layer 203. The separation starting point may be formed by, for example, inserting a sharp instrument such as a knife between the layers. Alternatively, the separation starting point may be formed by irradiating part of the separation layer 202 with laser light to melt, vaporize, or thermally destroy the part of the separation layer 202. Further alternatively, the separation starting point may be formed by dripping liquid (e.g., alcohol, water, or water containing carbon dioxide) onto an end portion of the separation layer 202 so that the liquid penetrates into an interface between the separation layer 202 and the separation layer 203 by using capillary action.

Then, physical force is gently applied to the area where the separation starting point is formed in a direction substantially perpendicular to the bonded surfaces, so that separation can be caused without damage to the separation layer 203. At this time, separation may be caused by attaching tape or the like to the supporting substrate 201 or the substrate 131 and pulling the tape in the aforementioned direction, or separation may be caused by pulling an end portion of the supporting substrate 201 or the substrate 131 with a hook-like member. Alternatively, separation may be caused by pulling an adhesive member or a member capable of vacuum suction attached to the back side of the supporting substrate 201 or the substrate 131. Further alternatively, separation may be caused by pressing an adhesive roller to the back side of the supporting substrate 201 or the substrate 131 and rolling and moving the roller.

Here, if separation is performed in such a manner that liquid containing water such as water or an aqueous solution is added to the separation interface and the liquid penetrates into the separation interface, the separation property can be improved.

The separation is mainly caused inside the oxide layer 211 and at the interface between the oxide layer 211 and the separation layer 202. Thus, as illustrated in FIG. 8D, the oxide layer 211 might be attached to the surfaces of the separation layer 202 and the separation layer 203 after the separation. In FIG. 8D, the oxide layer 211a attached on the separation layer 203 side and the oxide layer 211b attached on the separation layer 202 side are illustrated. Note that the thickness of the attached oxide layer 211a may be different from that of the attached oxide layer 211b. Since separation is easily caused at the interface between the oxide layer 211 and the separation layer 202, the thickness of the oxide layer 211a on the separation layer 203 side is larger than that of the oxide layer 211b on the separation layer 202 side in many cases.

<Bonding>

Figure 8E:
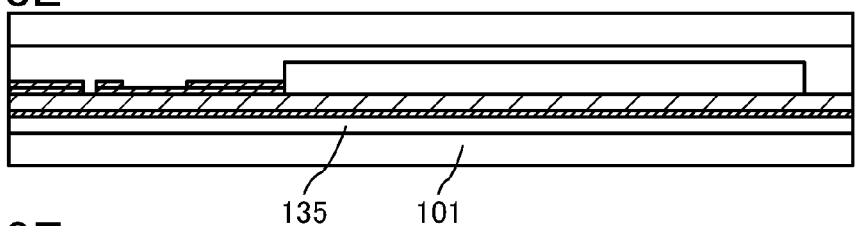

Then, as illustrated in FIG. 8E, the substrate 101 is bonded to the separation interface side of the separation layer 203 with an adhesive layer 135 interposed therebetween. For the materials that can be used for the adhesive layer 135 and the substrate 101, the above description of the adhesive layer 132 and the substrate 131 can be referred to.

<Exposure of Wiring>

Figure 8F:
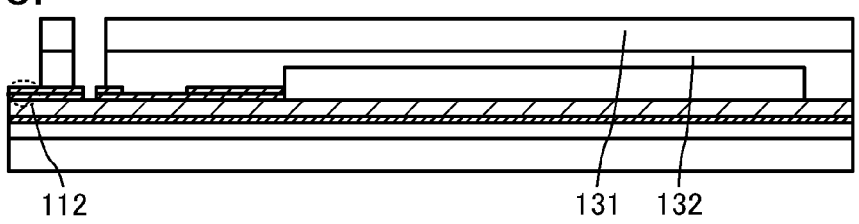

Next, to expose part of a surface of the wiring 111 and part of a surface of the wiring 114, part of the substrate 131 and part of the adhesive layer 132 are removed and an opening is formed (FIG. 8F).

For example, in the case of using a resin as the substrate 131, a masking tape or the like is provided so as to surround the area for the opening, a solvent for dissolving the substrate 131 and the adhesive layer 132 is dropped into the surrounded area, and the dissolved substrate 131 and the dissolved adhesive layer 132 are removed; thus, the opening that exposes part of the wiring 111 or the wiring 114 can be formed. Alternatively, after cutting an indentation into an upper surface of the substrate 131 around the area for the opening with a cutting instrument such as a cutter, the substrate 131 and the adhesive layer 132 are separated physically. Further alternatively, part of the substrate 131 and part of the adhesive layer 132 are removed by irradiation with laser light or the like.

Through the above-described process, a display device of one embodiment of the present invention can be manufactured.

Note that the method for forming the display portion 102, the wiring 111, and the wiring 114 over the flexible substrate 101 is not limited to the above-described method; the display portion 102, the wiring 111 and the wiring 114 may be directly formed over the substrate 101. In the case where the substrate 101 has heat resistance to the heat applied in the formation process of the display portion 102, the wiring 111 or the wiring 114, the method of directly forming the display portion 102, the wiring 111 and the wiring 114 over the substrate 101 is preferable in terms of process simplicity. In this case, the display portion 102, the wiring 111 and the wiring 114 are preferably formed in a state where the substrate 101 is fixed to a supporting member, in which case transfer of the element in an apparatus and between apparatuses for forming the display portion 102, the wiring 111 and the wiring 114 can be easy.

Further, the combination of the materials of the separation layers can be selected without being limited to the above example so that separation occurs at the interface between the separation layers or in the separation layers. For example, a combination of low adhesive materials such as metal and a resin may be employed.

The separation layer on the supporting substrate side is not necessary in the case where separation can occur at an interface between the supporting substrate and the separation layer on the display portion side. For example, glass is used as the supporting substrate, an organic resin such as polyimide is used as the separation layer on the display portion side, and separation is performed by heating the organic resin. Alternatively, a metal layer may be provided between the supporting substrate and the separation layer on the display portion side formed of an organic resin, and separation may be performed at the interface between the metal layer and the separation layer by heating the metal layer by feeding a current to the metal layer.

This embodiment can be implemented in combination with any of the other embodiments disclosed in this specification as appropriate.

Embodiment 3

In this embodiment, specific configuration examples of the display device described in Embodiment 1 will be described with reference to drawings. Examples of an image display device to which an organic EL element is used will be described below.

[Configuration Example 1 of Display Device]

Figure 9:
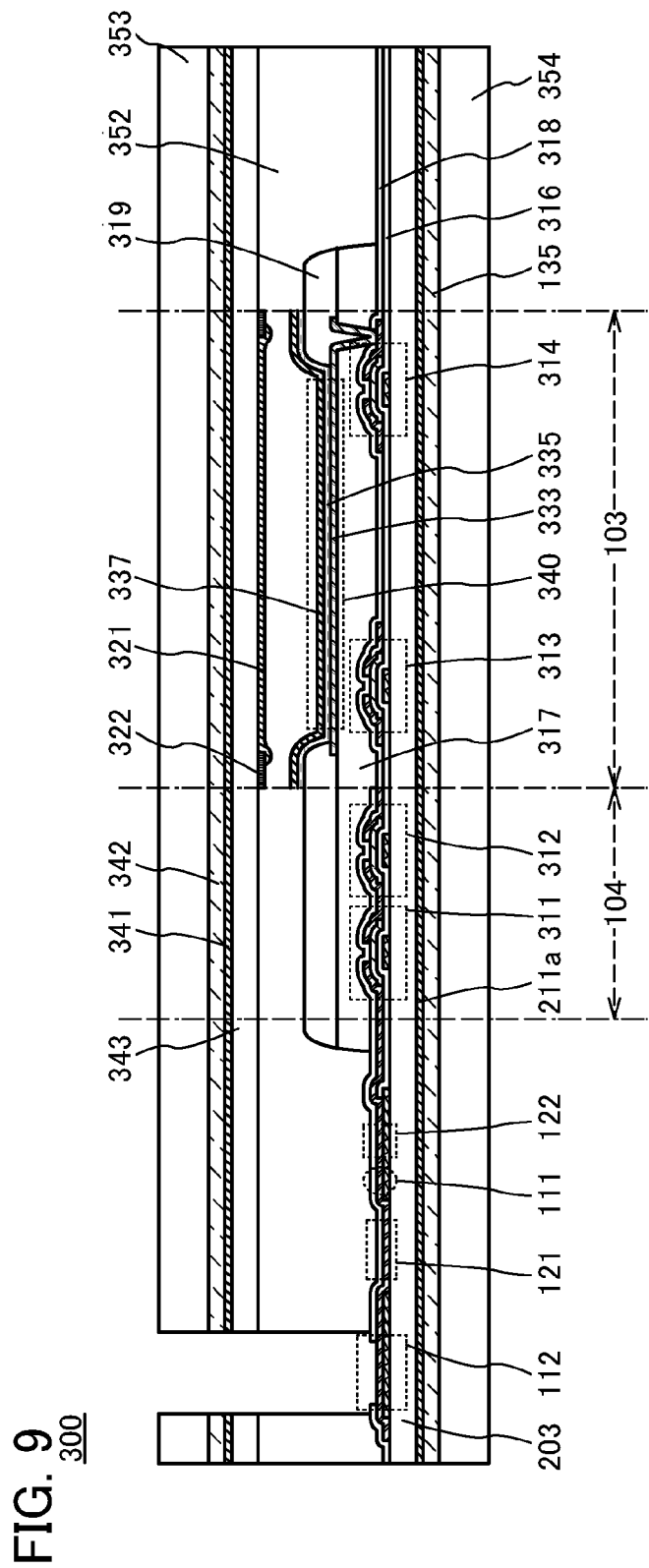
FIG. 9 illustrates a structural example of a display device of one embodiment.

FIG. 9 is a schematic cross-sectional view of a display device 300 with a top emission structure. The schematic top view of the display device 300 of FIG. 9 corresponds to FIG. 1A, and FIG. 9 corresponds to a schematic cross-sectional view of the region including the display portion 102, the wiring 111, and the connection terminal 112 in FIGS. 1A and 1B.

The display device 300 includes the separation layer 203 over a flexible substrate 354 with an adhesive layer 135 interposed therebetween. The display device 300 further includes, over the separation layer 203, the pixel portion 103 including a light-emitting element 340, the driver circuit 104, the wiring 111, and the connection terminal 112. Further, a flexible substrate 353 is provided to face the substrate 354 with a sealing layer 352 interposed therebetween.

The wiring 111 includes the first portion 121 and the second portion 122 that have different thicknesses. The thick portion (the second portion 122 in FIG. 9) of the wiring 111 has a stacked structure including the same conductive film as the gate electrode of a transistor that is described later and the same conductive film as the source electrode and the drain electrode of the transistor. The thin portion (the first portion 121 in FIG. 9) of the wiring 111 is formed of the same conductive film as the source electrode and the drain electrode of the transistor. In addition, part of the surface of the wiring 111 is exposed to form the connection terminal 112.

Examples of materials that can be used in an electrode and a wiring in the transistor and the display element include a metal such as Al, Ti, Cr, Co, Ni, Cu, Y, Zr, Mo, Ru, Ag, Ta, or W, an alloy including the metal, and a nitride of the metal. In the case where the wiring 111 is formed by processing the same conductive film as the electrode and the wiring included in the transistor and the display element, because such a conductive film is thin enough in most cases, destruction or a break by bending does not occur even when the material of the conductive film has low ductility or low malleability.

FIG. 9 illustrates a circuit in which an n-channel transistor 311 and an n-channel transistor 312 are combined as an example of part of the driver circuit 104. Note that the driver circuit 104 is not limited to the circuit in which the n-channel transistors are combined and may include a variety of circuits such as a CMOS circuit in which an n-channel transistor and a p-channel transistor are combined or a circuit in which p-channel transistors are combined.

FIG. 9 illustrates a cross-sectional structure of one pixel as an example of the pixel portion 103. The pixel includes a switching transistor 313, a current control transistor 314, and a first electrode 333 electrically connected to an electrode (a source electrode or a drain electrode) of the current control transistor 314. An insulating layer 319 is provided to cover an end portion of the first electrode 333.

The light-emitting element 340 has a stacked structure in which the first electrode 333, an EL layer 335, and a second electrode 337 are sequentially stacked over an insulating layer 317. Since the display device 300 described in this configuration example is a top emission display device, a light-transmitting material is used for the second electrode 337. A reflective material is preferably used for the first electrode 333. The EL layer 335 contains at least a light-emitting organic compound. When voltage is applied between the first electrode 333 and the second electrode 337 between which the EL layer 335 is interposed so that current flows to the EL layer 335, the light-emitting element 340 can emit light.

A separation layer 343 is provided on a surface of the flexible substrate 353 which faces the substrate 354, with an adhesive layer 342 interposed therebetween. In addition, a color filter 321 is provided on the separation layer 343 in a position overlapping the light-emitting element 340, and a black matrix 322 is provided in a position overlapping the insulating layer 319. The separation layer 343 is formed using the same materials as the separation layer 203.

Note that a touch sensor may be formed by providing a wiring formed of a transparent conductive film over a surface of the substrate 353 which does not face the substrate 354. A touch sensor formed over a flexible substrate, which is not the substrate 353 or the substrate 354, may be provided so as to overlap with the substrate on the light emission side. Further, in the case of employing a touch sensor including an optical sensor, a plurality of photoelectric conversion elements are arranged in a matrix in the pixel portion 103.

The separation layer 203 and the separation layer 343 have functions of inhibiting the diffusion of impurities contained in the substrate 354 and the substrate 353, respectively. It is preferable that an insulating layer 316 and an insulating layer 318 which are in contact with semiconductor layers of the transistors inhibit the diffusion of impurities into the semiconductor layers. These insulating layers can be formed using, for example, an oxide or a nitride of a semiconductor such as silicon or a metal such as aluminum. A stack including such inorganic insulating materials or a stack including such an inorganic insulating material and an organic insulating material may be used.

As the inorganic insulating material, for example, a material selected from aluminum nitride, aluminum oxide, aluminum nitride oxide, aluminum oxynitride, magnesium oxide, gallium oxide, silicon nitride, silicon oxide, silicon nitride oxide, silicon oxynitride, germanium oxide, zirconium oxide, lanthanum oxide, neodymium oxide, and tantalum oxide can be used. A single layer or a stack including any of the above materials may be formed. In this specification, the nitride oxide refers to a material containing a larger amount of nitrogen than oxygen, and the oxynitride refers to a material containing a larger amount of oxygen than nitrogen. The element content can be measured by, for example, Rutherford back scattering spectrometry (RBS). As the inorganic insulating material, a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide may be used.

The separation layer 343 can be formed by applying the method described in Embodiment 2. That is, the structure illustrated in FIG. 9 can be obtained in the following manner: the separation layer, the oxide layer, and the separation layer 343 are formed over the supporting substrate, the color filter 321 and the black matrix 322 are formed over the separation layer 343, separation is performed, and then the substrate 353 is bonded to the back side of the separation layer 343 with the adhesive layer 342 interposed therebetween.

As illustrated in FIG. 9, the oxide layer 211a and the oxide layer 341 may be provided between the separation layer 203 and the adhesive layer 135, and between the separation layer 343 and the adhesive layer 342, respectively. The oxide layer 211a and the oxide layer 341 are extremely thin and have light-transmitting properties, and thus hardly decrease emission efficiency even when provided on the side where light emitted from the light-emitting element 340 is extracted.

It is preferable that the separation layer 203 provided with the transistors and the like and the separation layer 343 provided with the color filter 321 and the like be bonded to each other with the sealing layer 352 in the state where the supporting substrates are attached to the respective separation layers before separation is performed. It is preferable that the separation layers be separated from the respective substrates after the bonding. In the case where the color filter 321 and pixels need to be aligned with high accuracy particularly as in the display device including the high-definition pixel portion 103, the layers are bonded while being fixed to supporting substrates such as glass substrates, whereby the color filter 321 and the pixels can be aligned with high accuracy. By the above-described method, a high-definition, flexible display device can be manufactured.

Note that although FIG. 9 illustrates the case where the light-emitting element is used as a display element, one embodiment of the present invention is not limited thereto. It is possible to use a liquid crystal element, an electrophoretic element (electronic paper), or the like as a display element. An electrophoretic element is preferable for one embodiment of a flexible display device because a backlight is not required.

[Configuration Example 2 of Display Device]

In this configuration example, a display device with a bottom-emission structure is described. Note that the same parts as those in Configuration Example 1 are not described here.

Figure 10:
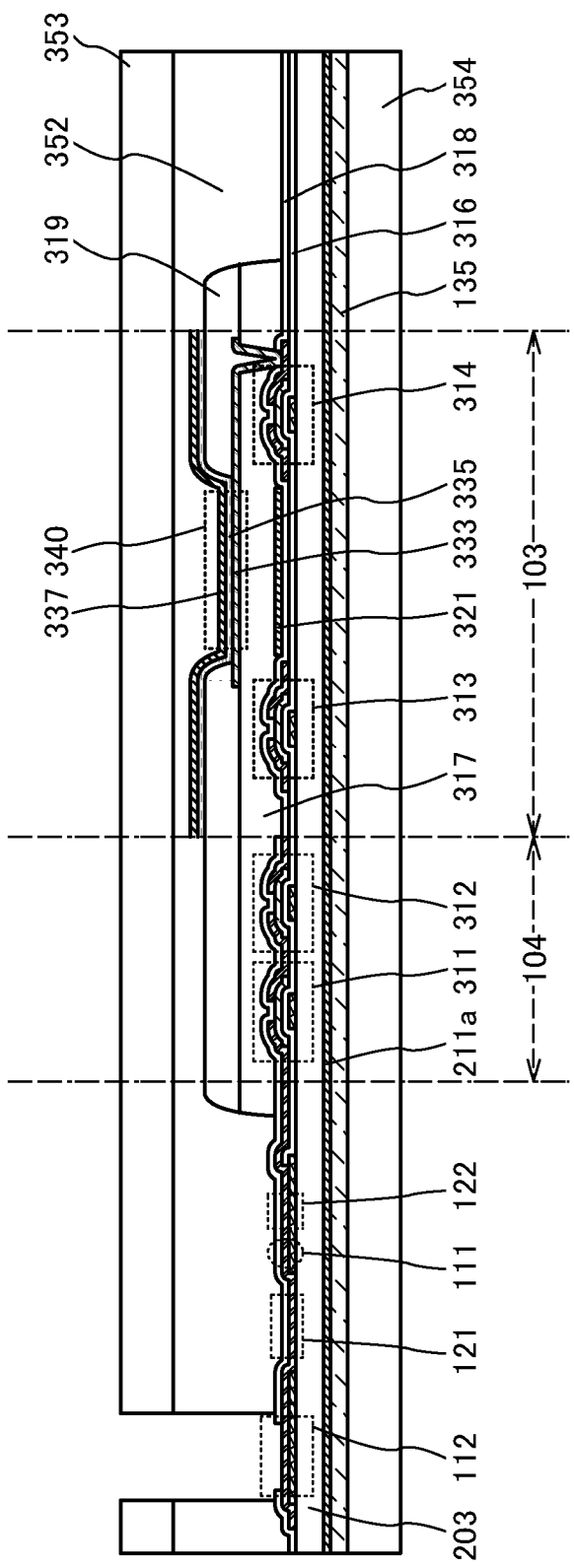
FIG. 10 illustrates a structural example of a display device of one embodiment.

FIG. 10 is a schematic cross-sectional view of a display device 350 described in this Configuration example.

The display device 350 is different from the display device 300 described in Configuration Example 1 mainly in the following points. In the display device 350, a color filter 321 is provided between the substrate 354 and the light-emitting element 340. In addition, the flexible substrate 353 is in direct contact with the sealing layer 352, and the separation layer 343 and the adhesive layer 342 that are provided in the display device 300 are not provided.

In the light-emitting element 340, a light-transmitting material is used for the first electrode 333, and a reflective material is used for the second electrode 337. Thus, light emission from the EL layer 335 is transmitted through the substrate 354.

Further, the color filter 321 is provided at the position over the insulating layer 318 covering transistors which overlaps with the light-emitting element 340. The insulating layer 317 is provided to cover the color filter 321.

A material that is not permeable to an impurity such as water from the outside of the substrate 353 is preferably used as the substrate 353. Alternatively, a film formed of the above-described insulating material, which has a function of inhibiting the diffusion of impurities, is preferably provided on a surface of the substrate 353 which is in contact with the sealing layer 352.

[Materials and Formation Methods]

Materials and formation methods which can be used for the components described above will be described below.

<Flexible Substrate>

As a material for the flexible substrate, an organic resin, a glass substrate thin enough to have flexibility, or the like can be used.

Examples of such materials are polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low, for example, lower than or equal to $30 \times 10^{-6}$/K is preferable, and a polyamide imide resin, a polyimide resin, or PET can be suitably used. A substrate in which a fibrous body is impregnated with a resin (also referred to as prepreg) or a substrate whose thermal expansion coefficient is reduced by mixing an inorganic filler with an organic resin can also be used.

In the case where a fibrous body is included in the above material, a high-strength fiber of an organic compound or an inorganic compound is used as the fibrous body. The high-strength fiber is specifically a fiber with a high tensile modulus of elasticity or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As an example of the glass fiber, a glass fiber using E glass, S glass, D glass, Q glass, or the like can be given. These fibers may be used in a state of a woven fabric or a nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

A material capable of transmitting light emitted from the EL layer 335 is used for the flexible substrate through which light emitted from the light-emitting element 340 is transmitted. To improve the outcoupling efficiency of the material provided on the light extraction side, the refractive index of the flexible, light-transmitting material is preferably high. For example, a substrate obtained by dispersing an inorganic filler having a high refractive index into an organic resin can have a higher refractive index than the substrate formed of only the organic resin. In particular, an inorganic filler having a particle diameter as small as 40 nm or less is preferably used, in which case such a filler can maintain optical transparency.

Since the substrate provided on the side opposite to the side through which light is transmitted does not need to have a light-transmitting property, a metal substrate or the like can be used as well as the above substrates. To obtain flexibility and bendability, the thickness of a metal substrate is preferably greater than or equal to 10 μm and less than or equal to 200 μm, further preferably greater than or equal to 20 μm and less than or equal to 50 μm. Although there is no particular limitation on a material of the metal substrate, it is preferable to use, for example, aluminum, copper, nickel, a metal alloy such as an aluminum alloy or stainless steel. A conductive substrate containing a metal or an alloy material is preferably used as the flexible substrate provided on the side through which light is not transmitted, in which case heat dissipation of the heat generated from the light-emitting element 340 can be increased.

In the case where a conductive substrate is used, it is preferable to use a substrate subjected to insulation treatment in such a manner that a surface of the substrate is oxidized or an insulating film is formed over the surface of the substrate. For example, an insulating film may be formed over the surface of the conductive substrate by an electrodeposition method, a coating method such as a spin-coating method or a dip method, a printing method such as a screen printing method, or a deposition method such as an evaporation method or a sputtering method. Alternatively, the surface of the substrate may be oxidized by being exposed to an oxygen atmosphere or heated in an oxygen atmosphere or by an anodic oxidation method.

In the case where the flexible substrate has an uneven surface, a planarization layer may be provided to cover the unevenness so that a flat insulating surface is formed. An insulating material can be used for the planarization layer; an organic material or an inorganic material can be used. The planarization layer can be formed by a deposition method such as a sputtering method, a coating method such as a spin-coating method or a dip method, a discharging method such as an ink jet method or a dispensing method, a printing method such as a screen printing method, or the like.

As the flexible substrate, a material in which a plurality of layers are stacked can also be used. For example, a material in which two or more kinds of layers formed of an organic resin are stacked, a material in which a layer formed of an organic resin and a layer formed of an inorganic material are stacked, or a material in which two or more kinds of layers formed of an inorganic material are stacked is used. With a layer formed of an inorganic material, moisture and the like are prevented from entering the inside, resulting in improved reliability of the light-emitting device.

As the inorganic material, an oxide material, a nitride material, or an oxynitride material of a metal or a semiconductor, or the like can be used. For example, silicon oxide, silicon nitride, silicon oxynitride, aluminum oxide, aluminum nitride, or aluminum oxynitride may be used.

For example, in the case where a layer formed of an organic resin and a layer formed of an inorganic material are stacked, the layer formed of an inorganic material can be formed over or under the layer formed of an organic resin by a sputtering method, a CVD method, a coating method, or the like.

<Light-Emitting Element>

In the light-emitting element 340, a light-transmitting material capable of transmitting light emitted from the EL layer 335 is used for an electrode provided on the side through which light is transmitted.

As the light-transmitting material, indium oxide, indium oxide-tin oxide, indium oxide-zinc oxide, zinc oxide, zinc oxide to which gallium is added, or the like can be used. Graphene may also be used. The conductive layer of the above-described electrode may be formed using a metal material such as gold, silver, platinum, magnesium, nickel, tungsten, chromium, molybdenum, iron, cobalt, copper, palladium, and titanium; or an alloy material containing any of these metal materials. A nitride of the metal material (e.g., titanium nitride) or the like may also be used. In the case of using the metal material (or the nitride thereof), the thickness is set small enough to be able to transmit light. Alternatively, a stack including any of the above materials can also be used as the conductive layer of the above-described electrode. For example, a stacked film including a silver-magnesium alloy and indium oxide-tin oxide is preferably used, in which case electrical conductivity can be increased.

Such an electrode is formed by an evaporation method, a sputtering method, or the like. A discharging method such as an ink-jet method, a printing method such as a screen printing method, or a plating method may be used.

Note that when the above conductive oxide having a light-transmitting property is formed by a sputtering method, the use of a deposition atmosphere containing argon and oxygen allows the light-transmitting property to be increased.

Further, in the case where the conductive oxide film is formed over the EL layer, a first conductive oxide film formed under an atmosphere containing argon with a reduced oxygen concentration and a second conductive oxide film formed under an atmosphere containing argon and oxygen are preferably stacked, in which case film formation damage to the EL layer can be reduced. In this case, in the formation of the first conductive oxide film, it is preferable to use an argon gas with high purity, for example, an argon gas whose dew point is lower than or equal to −70° C., further preferably lower than or equal to −100° C.

A material capable of reflecting light emitted from the EL layer 335 is preferably used for the electrode provided on the side opposite to the side through which light is transmitted.

As the light-reflecting material, for example, a metal such as aluminum, gold, platinum, silver, nickel, tungsten, chromium, molybdenum, iron, cobalt, copper, or palladium or an alloy containing any of these metals can be used. Alternatively, lanthanum, neodymium, germanium, or the like may be added to the metal or the alloy. In addition, any of the following can be used: alloys containing aluminum (aluminum alloys) such as an alloy of aluminum and titanium, an alloy of aluminum and nickel, and an alloy of aluminum and neodymium; and alloys containing silver such as an alloy of silver and copper, an alloy of silver, palladium, and copper, and an alloy of silver and magnesium. An alloy of silver and copper is preferable because of its high heat resistance. Further, by stacking a metal film or a metal oxide film in contact with an aluminum alloy film, oxidation of the aluminum alloy film can be suppressed. Examples of a material for the metal film or the metal oxide film are titanium and titanium oxide. Further alternatively, a stack including a film containing any of the above light-transmitting materials and a film containing any of the above metal materials may be used. For example, a stacked film including silver and indium oxide-tin oxide, a stacked film including a silver-magnesium alloy and indium oxide-tin oxide, or the like can be used.

Such an electrode is formed by an evaporation method, a sputtering method, or the like. A discharging method such as an ink-jet method, a printing method such as a screen printing method, or a plating method may be used.

The EL layer 335 includes at least a layer containing a light-emitting organic compound (hereinafter also called a light-emitting layer), and may be either a single layer or a stack including a plurality of layers. One example of the structure in which a plurality of layers is stacked is a structure in which a hole-injection layer, a hole-transport layer, a light-emitting layer, an electron-transport layer, and an electron-injection layer are stacked in this order from an anode side. Note that all of these layers except the light-emitting layer are not necessarily provided in the EL layer 335. Further, multiple layers of any of these layers may be provided. Specifically, in the EL layer 335, a plurality of light-emitting layers may overlap each other or another hole-injection layer may overlap the electron-injection layer. Furthermore, another component such as an electron-relay layer may be added as appropriate as an intermediate layer, in addition to the charge generation layer. Alternatively, a plurality of light-emitting layers exhibiting different colors may be stacked. For example, a white emission can be obtained by stacking two or more layers emitting light of complementary colors.

The EL layer 335 can be formed by a vacuum evaporation method, a discharging method such as an ink-jet method or a dispensing method, or a coating method such as a spin-coating method.

<Adhesive Layer and Sealing Layer>

As the adhesive layer and the sealing layer, it is possible to use, for example, a gel or a curable material such as a two-component-mixture type resin which is curable at room temperature, a thermosetting resin, or a light curable resin. For example, an epoxy resin, an acrylic resin, a silicone resin, a phenol resin, polyimide, polyvinyl chloride (PVC), polyvinyl butyral (PVB), or ethylene vinyl acetate (EVA) can be used. In particular, a material with low moisture permeability, such as an epoxy resin, is preferable.

A drying agent may be contained in the adhesive layer and the sealing layer. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used as the drying agent. In the case where the drying agent is applied to a lighting device, when a granular drying agent is employed, light emitted from the light-emitting element 340 is diffusely reflected by the drying agent; thus, a highly reliable light-emitting device with improved viewing angle dependence, which is particularly useful for lighting and the like, can be achieved.

<Color Filter and Black Matrix>

The color filter 321 is provided in order to adjust the color of light emitted from the light-emitting element 340 to increase the color purity. For example, in a full-color display device using white light-emitting elements, a plurality of pixels provided with color filters of different colors are used. In that case, the color filters may be those of three colors of red (R), green (G), and blue (B) or four colors (yellow (Y) in addition to these three colors). Further, a white (W) pixel may be added to R, G, and B pixels (and a Y pixel). That is, color filters of four colors (or five colors) may be used.

The black matrix 322 is provided between the adjacent color filters 321. The black matrix 322 shields a pixel from light emitted from the light-emitting element 340 in an adjacent pixel, thereby preventing color mixture between the adjacent pixels. When the color filter 321 is provided so that its end portion overlaps the black matrix 322, light leakage can be reduced. The black matrix 322 can be formed using a material that blocks light emitted from the light-emitting element 340, for example, a metal or an organic resin containing a pigment. Note that the black matrix 322 may be provided in a region other than the pixel portion 103, for example, in the driver circuit 104.

An overcoat may be formed to cover the color filter 321 and the black matrix 322. The overcoat protects the color filter 321 and the black matrix 322 and suppresses diffusion of impurities included in the color filter 321 and the black matrix 322. The overcoat is formed using a material that transmits light emitted from the light-emitting element 340, and can be formed using, for example, an inorganic insulating film or an organic insulating film.

The materials and the formation methods have been described so far.

This embodiment can be implemented in combination with any of the other embodiments disclosed in this specification as appropriate.

Embodiment 4

In this embodiment, examples of an electronic device that includes a display device of one embodiment of the present invention will be described.

The display device of one embodiment of the present invention has a bendable display surface. Examples of the electronic device in which the display device can be incorporated include television sets (also referred to as televisions or television receivers), monitors of computers or the like, digital cameras, digital video cameras, digital photo frames, mobile phones (also referred to as cell phones or cellular phones), portable game consoles, personal digital assistants, audio reproducing devices, and large-sized game machines such as pachinko machines. In addition, a lighting device or a display device can be incorporated along a curved inside/outside wall surface of a house or a building or a curved interior/exterior surface of a car.

Figure 11A:
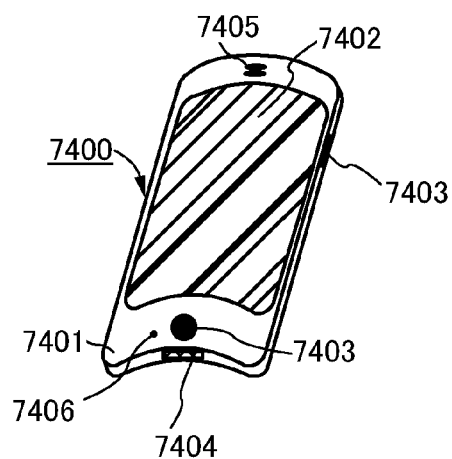
FIGS. 11A to 11C illustrate structural examples of an electronic device of one embodiment.

FIG. 11A illustrates an example of a mobile phone. A mobile phone 7400 is provided with a display portion 7402 incorporated in a housing 7401, operation buttons 7403, an external connection port 7404, a speaker 7405, a microphone 7406, and the like. Note that the mobile phone 7400 is manufactured by using the display device of one embodiment of the present invention for the display portion 7402.

When the display portion 7402 is touched with a finger or the like, data can be input into the mobile phone 7400 in FIG. 11A. Further, operations such as making a call and inputting text can be performed by touch on the display portion 7402 with a finger or the like.

The power can be turned on or off with the operation buttons 7403. In addition, types of images displayed on the display portion 7402 can be switched; for example, switching images from a mail creation screen to a main menu screen is performed with the operation buttons 7403.

Here, the display portion 7402 includes the display device of one embodiment of the present invention. Thus, images can be displayed on the bent display surface, and the mobile phone can have high reliability.

Figure 11B:
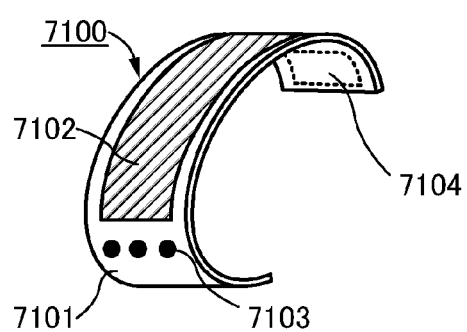

FIG. 11B illustrates an example of a wristband-type display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation button 7103, power ON/OFF, switching of displayed videos, adjusting volume, and the like can be performed.

Here, the display portion 7102 includes the display device of one embodiment of the present invention. Thus, the portable display device can have a bent display portion and have high reliability.

Figure 11C:
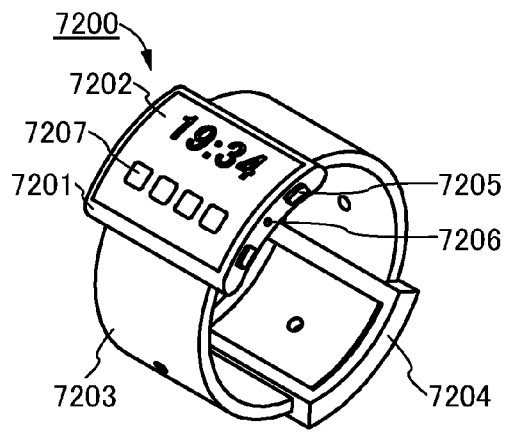

FIG. 11C illustrates an example of a wrist-watch-type portable information terminal. A portable information terminal 7200 includes a housing 7201, a display portion 7202, a band 7203, a buckle 7204, an operation button 7205, an input output terminal 7206, and the like.

The portable information terminal 7200 is capable of executing a variety of applications such as mobile phone calls, e-mailing, viewing and editing texts, music reproduction, Internet communication, and a computer game.

The display surface of the display portion 7202 is bent, and images can be displayed on the bent display surface. Further, the display portion 7202 includes a touch sensor, and operation can be performed by touching the screen with a finger, a stylus, or the like. For example, by touching an icon 7207 displayed on the display portion 7202, application can be started.

With the operation button 7205, a variety of functions such as power ON/OFF, ON/OFF of wireless communication, setting and cancellation of manner mode, and setting and cancellation of power saving mode can be performed. For example, the functions of the operation button 7205 can be set freely by setting the operation system incorporated in the portable information terminal 7200.

Further, the portable information terminal 7200 can employ near field communication. In that case, for example, mutual communication between the portable information terminal 7200 and a headset capable of wireless communication can be performed, and thus hands-free calling is possible.

Moreover, the portable information terminal 7200 includes the input output terminal 7206, and data can be directly transmitted to and received from another information terminal via a connector. Power charging through the input output terminal 7206 is possible. Note that the charging operation may be performed by wireless power feeding without using the input output terminal 7206.

The display device of one embodiment of the present invention can be used in the display portion 7202 of the portable information terminal 7200.

The display device of one embodiment of the present invention can be used in display portions of the electronic devices described in this embodiment. Therefore, the electronic devices can each have high reliability, display images on the curved surface, and have a short side frame.

This embodiment can be implemented in combination with any of the other embodiments disclosed in this specification as appropriate.

EXPLANATION OF REFERENCE

100: display device, 101: substrate, 102: display portion, 103: pixel portion, 104: driver circuit, 104*a*: driver circuit, 104*b*: driver circuit, 104*c*: driver circuit, 104*d*: driver circuit, 104*e*: driver circuit, 104*f*: driver circuit, 104*g*: driver circuit, 104*h*: driver circuit, 110: bending portion, 111: wiring, 111*a*: wiring, 111*b*: wiring, 112: connection terminal, 113: IC, 114: wiring, 120: bending portion, 121: first portion, 122: second portion, 131: substrate, 132: adhesive layer, 133: ACF, 134: bump, 135: adhesive layer, 141: curved surface, 142: tangent line, 143: bending direction, 144: line, 145: surface, 151: wiring, 201: supporting substrate, 202: separation layer, 203: separation layer, 211: oxide layer, 211*a*: oxide layer, 211*b*: oxide layer, 300: display device, 311: transistor, 312: transistor, 313: transistor, 314: transistor, 316: insulating layer, 317: insulating layer, 318: insulating layer, 319: insulating layer, 321: color filter, 322: black matrix, 333: electrode, 335: EL layer, 337: electrode, 340: light-emitting element, 341: oxide layer, 342: adhesive layer, 343: separation layer, 350: display device, 352: sealing layer, 353: substrate, 354: substrate, 7100: portable display device, 7101: housing, 7102: display portion, 7103: operation button, 7104: sending and receiving device, 7200: portable information terminal, 7201: housing, 7202: display portion, 7203: band, 7204: buckle, 7205: operation button, 7206: input output terminal, 7207: icon, 7400: mobile phone, 7401: housing, 7402: display portion, 7403: operation button, 7404: external connection port, 7405: speaker, 7406: microphone.

This application is based on Japanese Patent Application serial no. 2013-045119 filed with Japan Patent Office on Mar. 7, 2013, the entire contents of which are hereby incorporated by reference.

The invention claimed is:

1. A display device comprising:
   a flexible substrate;
   a display portion over the flexible substrate;
   a connection terminal to which a signal from an outside is input, over the flexible substrate; and
   a wiring electrically connecting the connection terminal with the display portion, over the flexible substrate,
   wherein the wiring includes a first wiring and a second wiring,
   wherein each of the first wiring and the second wiring includes a first portion and a second portion,
   wherein the first portion has a same width as the second portion,
   wherein at least two openings are opened in the first portion, and
   wherein the flexible substrate can be bent in a region overlapping with the first portion.

2. The display device according to claim 1,
wherein the first portion has a smaller thickness than the second portion.

3. The display device according to claim 1,
wherein the first portion has a larger width than the second portion.

4. The display device according to claim 1,
wherein the flexible substrate includes a projecting part, and
wherein the connection terminal and part of the wiring are provided over the projecting part.

5. The display device according to claim 4,
wherein the projecting part can be folded toward a rear side of the flexible substrate.

6. A display device according to claim 1, further comprising an IC over the flexible substrate,
wherein the IC is electrically connected to the display portion via a third wiring, and
wherein the IC is provided between the first portion and the connection terminal.

7. The display device according to claim 1,
wherein the first portion includes a first conductive film, and
wherein the second portion includes a stack of the first conductive film and a second conductive film.

8. The display device according to claim 7,
wherein a gate electrode of a transistor included in the display portion is formed by processing the same film as one of the first conductive film and the second conductive film, and
wherein source and drain electrodes of the transistor are formed by processing the same film as the other of the first conductive film and the second conductive film.

9. An electronic device including the display device according to claim 1.

10. A display device comprising:
a flexible substrate;
a display portion over the flexible substrate;
a connection terminal to which a signal from an outside is input, over the flexible substrate; and
a wiring electrically connecting the connection terminal with the display portion, over the flexible substrate,
wherein the wiring includes a first wiring and a second wiring,
wherein each of the first wiring and the second wiring includes a first portion and a second portion,
wherein the first portion has a same width as the second portion,
wherein at least two openings are opened in the first portion, and
wherein the flexible substrate can be bent in a region overlapping with the first portion, and
wherein a bending direction of the flexible substrate is not the same as an extending direction of the wiring in the first portion.

11. The display device according to claim 10,
wherein the first portion has a smaller thickness than the second portion.

12. The display device according to claim 10,
wherein the first portion has a larger width than the second portion.

13. The display device according to claim 10,
wherein the flexible substrate includes a projecting part, and
wherein the connection terminal and part of the wiring are provided over the projecting part.

14. The display device according to claim 13,
wherein the projecting part can be folded toward a rear side of the flexible substrate.

15. A display device according to claim 10, further comprising an IC over the flexible substrate,
wherein the IC is electrically connected to the display portion via a third wiring, and
wherein the IC is provided between the first portion and the connection terminal.

16. The display device according to claim 10,
wherein the first portion includes a first conductive film, and
wherein the second portion includes a stack of the first conductive film and a second conductive film.

17. The display device according to claim 16,
wherein a gate electrode of a transistor included in the display portion is formed by processing the same film as one of the first conductive film and the second conductive film, and
wherein source and drain electrodes of the transistor are formed by processing the same film as the other of the first conductive film and the second conductive film.

18. An electronic device including the display device according to claim 10.

* * * * *